(12) United States Patent
Benisty et al.

(10) Patent No.: US 10,055,164 B2
(45) Date of Patent: Aug. 21, 2018

(54) DATA STORAGE AT AN ACCESS DEVICE

(71) Applicant: SANDISK TECHNOLOGIES LLC, Plano, TX (US)

(72) Inventors: Shay Benisty, Beer Sheva (IL); Ishai Ilani, Dolev (IL); Judah Gamliel Hahn, Ofra (IL); Itshak Afriat, Tel-Mons (IL); Alon Marcu, Tel-Mond (IL); Erez Frank, Kokav Yair (IL)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/395,680

(22) Filed: Dec. 30, 2016

(65) Prior Publication Data

US 2018/0067684 A1 Mar. 8, 2018

Related U.S. Application Data

(63) Continuation-in-part of application No. 15/258,688, filed on Sep. 7, 2016.

(51) Int. Cl.
*G06F 3/06* (2006.01)
*G06F 11/10* (2006.01)
*G11C 29/52* (2006.01)

(52) U.S. Cl.
CPC .......... *G06F 3/0647* (2013.01); *G06F 3/0613* (2013.01); *G06F 3/0685* (2013.01); *G06F 11/1068* (2013.01); *G11C 29/52* (2013.01)

(58) Field of Classification Search
None
See application file for complete search history.

(56) References Cited

U.S. PATENT DOCUMENTS

| | | | |
|---|---|---|---|
| 8,612,668 B2 | 12/2013 | Nishimoto et al. | |
| 8,645,438 B2* | 2/2014 | Chang | G06F 17/30091 707/809 |
| 9,286,320 B2* | 3/2016 | Kanfi | G06F 17/30227 |
| 9,507,722 B2 | 11/2016 | Desai et al. | |
| 2004/0034817 A1* | 2/2004 | Talagala | G11B 20/1803 714/42 |
| 2009/0125790 A1* | 5/2009 | Iyer | G06F 11/1068 714/773 |

(Continued)

OTHER PUBLICATIONS

Benisty et al., "Methods, Systems and Computer Readable Media for Aggregating Completion Entries in a Nonvolatile Storage Device," U.S. Appl. No. 14/929,317 filed Oct. 31, 2015, 30 pages.

*Primary Examiner* — Mujtaba M Chaudry
(74) *Attorney, Agent, or Firm* — Patterson & Sheridan, LLP; Steven Versteeg

(57) ABSTRACT

A device includes a non-volatile memory, first circuitry configured to communicate with the non-volatile memory, and second circuitry configured to communicate with an access device. The second circuitry is configured to retrieve data and metadata associated with the data from a volatile memory of the access device based on a request for the data. The request is received from the first circuitry and includes a first identifier. The metadata includes a second identifier. The second circuitry is further configured to provide at least a portion of the data to the first circuitry in response to the first identifier matching the second identifier.

18 Claims, 10 Drawing Sheets

(56) References Cited

U.S. PATENT DOCUMENTS

| | | | |
|---|---|---|---|
| 2012/0173953 A1* | 7/2012 | Flynn | G06F 8/665 |
| | | | 714/758 |
| 2015/0113355 A1* | 4/2015 | Kang | G06F 11/1048 |
| | | | 714/764 |
| 2016/0026406 A1 | 1/2016 | Hahn et al. | |
| 2016/0034345 A1* | 2/2016 | Royer, Jr. | G06F 11/1048 |
| | | | 714/766 |
| 2016/0050294 A1* | 2/2016 | Kruse | G06F 17/30194 |
| | | | 709/201 |
| 2016/0140007 A1* | 5/2016 | Cho | G06F 11/2205 |
| | | | 714/42 |
| 2016/0246726 A1 | 8/2016 | Hahn et al. | |
| 2016/0274797 A1 | 9/2016 | Hahn et al. | |

* cited by examiner

DATA STORAGE AT AN ACCESS DEVICE

CROSS REFERENCE TO RELATED APPLICATIONS

This application claims priority from and is a continuation-in-part application of U.S. patent application Ser. No. 15/258,688, filed on Sep. 7, 2016 and entitled "SYSTEM AND METHOD FOR PROTECTING FIRMWARE INTEGRITY IN A MULTI-PROCESSOR NON-VOLATILE MEMORY SYSTEM," the content of which is incorporated by reference herein in its entirety.

FIELD OF THE DISCLOSURE

The present disclosure is related to data storage devices and more particularly to storing data at a volatile memory.

BACKGROUND

Non-volatile data storage devices, such as embedded flash memory or removable storage cards, have allowed for increased portability of data and software applications. Flash memory devices may enhance data storage density by storing multiple bits in each flash memory cell. For example, Multi-Level Cell (MLC) flash memory devices provide increased storage density by storing 2 bits per cell, 3 bits per cell, 4 bits per cell, or more. Increasing the number of bits per cell and reducing device feature dimensions may increase a storage density of a memory device.

During operation of a data storage device, the data storage device may store frequently used data, such as data indicative of address translation tables or Flash translation layer mappings, in a volatile memory (e.g., a dynamic random access memory (DRAM)). Including a volatile memory within the data storage device increases size and cost of the data storage device. Instead of using an on-board volatile memory, some data storage devices can temporarily store data at a portion of a memory of an access device, such as a host memory buffer (HMB) of the access device. The data storage device may access the data by reading the data from the HMB. Because the HMB may be a portion of volatile memory that is otherwise used by other processing threads at the access device, occasionally data stored by the data storage device in the HMB may be inadvertently overwritten by a thread being executed at the access device. In order to meet data integrity criteria associated with one or more standards, such as a non-volatile memory standard, the access device or the data storage device may include additional elements dedicated to preserving data integrity. Such additional elements may increase costs of access devices and data storage devices.

DETAILED DESCRIPTION

Figure 1:
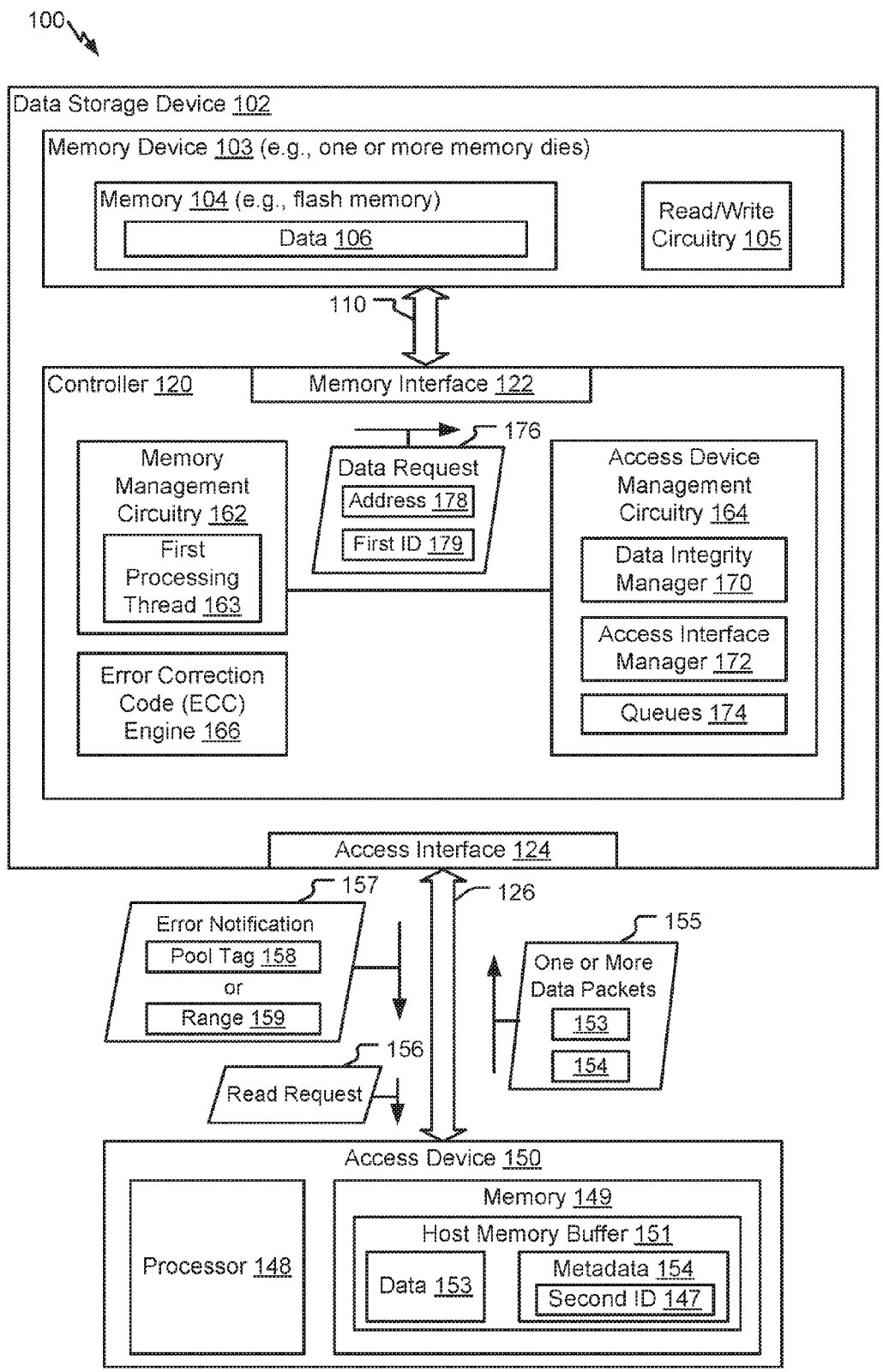
FIG. 1 is a block diagram of an illustrative example of a system including a data storage device configured to verify and selectively provide data read from a memory of an access device.

Particular implementations are described with reference to the drawings. In the description, common features are designated by common reference numbers throughout the drawings. As used herein, an ordinal term (e.g., "first," "second," "third," etc.) used to modify an element, such as a structure, a component, an operation, etc., does not by itself indicate any priority or order of the element with respect to another element, but rather merely distinguishes the element from another element having a same name (but for use of the ordinal term).

The present disclosure describes systems, devices, and methods of verifying and selectively using data read from a volatile memory of an access device at a data storage device. Instead of saving frequently used data at a volatile memory within the data storage device (which increases costs of the data storage device), the data storage device may be configured to store data and metadata associated with the data at a volatile memory of the access device, such as a host memory buffer (HMB) of the access device. The metadata may include error correction code (ECC) bits, cyclical redundancy check (CRC) bits, and an identifier that identifies circuitry or a processing thread that generated the data. The data and metadata may be stored at the HMB using one of multiple layouts, as further described herein.

When data is requested from the HMB by the data storage device, the data and the associated metadata may be provided to the data storage device. The data storage device may identify a first identifier within the metadata and compare the first identifier to a second identifier associated with a processing thread that requested the data. If the first identifier and the second identifier match, the data storage device may provide the data to the processing thread. If the first identifier and the second identifier do not match, the data storage device may send an error notification to the access device and may retrieve the requested data from a different location, such as a non-volatile memory of the data storage device. The error notification may enable the access device identify a section of the HMB that stores corrupt data and to perform one or more re-initialization or cleanup operations. In this manner, the data storage device is able to confirm data integrity that is provided to processing threads executing at the data storage device without including multiple additional data integrity elements.

The present disclosure also describes systems, devices, and methods of improving error correction and detection ability at an ECC engine of a data storage device. The ECC engine may be configured to detect up to ten errors and to correct one error by rotating a cyclic ECC code, such as a cyclic Bose-Chaudhuri-Hocquenghem (BCH) code. For example, the ECC engine may generate a codeword of the cyclic BCH code by encoding a received codeword that includes an error, and the ECC engine may rotate the BCH codeword until the error is within the parity section. Speed and efficiency of the decoding process may be improved by partitioning the codeword into multiple portions and rotating each portion concurrently, as further described herein.

FIG. 1 illustrates a system 100 that includes an access device 150 (e.g., a host device or another device) and a data storage device 102. The access device 150 is coupled to the data storage device 102 via a communication path 126. The communication path 126 may be a bus or a wireless connection, as non-limiting examples. The data storage device 102 may include an access interface 124 that enables communication via the communication path 126, such as when the access interface 124 is communicatively coupled to the access device 150 (e.g., the access interface 124 is configured to couple the data storage device 102 to the access device 150).

The access device 150 may include a memory interface (not shown) and may be configured to communicate with the data storage device 102 via the memory interface to read data from and write data to a memory device 103 of the data storage device 102. For example, the access device 150 may operate in compliance with a Joint Electron Devices Engineering Council (JEDEC) industry specification, such as a Universal Flash Storage (UFS) Access Controller Interface specification. As other examples, the access device 150 may operate in compliance with one or more other specifications, such as a Secure Digital (SD) Access Controller specification, as an illustrative, non-limiting example. The access device 150 may communicate with the memory device 103 in accordance with any other suitable communication protocol. The access device 150 may include a mobile telephone, a music player, a video player, a gaming console, an electronic book reader, a personal digital assistant (PDA), a computer, such as a laptop computer or notebook computer, a network computer, a server, any other electronic device, or any combination thereof, as illustrative, non-limiting examples.

The access device 150 may include a processor 148 and a memory 149. The memory 149 may be configured to store data and/or instructions that are executable by the processor 148. The memory 149 may be a single memory or may include multiple memories, such as one or more non-volatile memories, one or more volatile memories, or a combination thereof. In a particular implementation, the memory 149 includes at least one volatile memory, such as a dynamic random access memory (DRAM). The memory 149 may include a memory buffer, such as a host memory buffer (HMB) 151. The HMB 151 may be allocated for use by the data storage device 102.

The access device 150 may issue one or more commands to the memory device 103 of the data storage device 102, such as one or more requests to erase data, read data from, or write data to the memory device 103 of the data storage device 102. For example, the access device 150 may be configured to provide data to be stored at the memory device 103 or to request data to be read from the memory device 103.

The memory device 103 of the data storage device 102 may include one or more memory dies (e.g., one memory die, two memory dies, eight memory dies, or another number of memory dies). The memory device 103 includes a memory 104, such as a non-volatile memory of storage elements included in a memory die of the memory device 103. For example, the memory 104 may include a flash memory (e.g., a NAND flash memory, a NOR flash memory, etc.) or a resistive random access memory (ReRAM), as illustrative, non-limiting examples. In some implementations, the memory 104 may include or correspond to a memory die of the memory device 103. The memory 104 may have a three-dimensional (3D) memory configuration. As an example, the memory 104 may have a 3D vertical bit line (VBL) configuration. In a particular implementation, the memory 104 is a non-volatile memory having a 3D memory configuration that is monolithically formed in one or more physical levels of arrays of memory cells having an active area disposed above a silicon substrate. Alternatively, the memory 104 may have another configuration, such as a two-dimensional (2D) memory configuration or a non-monolithic 3D memory configuration (e.g., a stacked die 3D memory configuration).

Although the data storage device 102 is illustrated as including the memory device 103, in other implementations the data storage device 102 may include multiple memory devices that may be configured in a similar manner as described with respect to the memory device 103. For example, the data storage device 102 may include multiple memory devices, each memory device including one or more packages of memory dies, each package of memory dies including one or more memories such as the memory 104.

The memory 104 may include one or more blocks, such as a NAND flash erase group of storage elements. Each storage element of the memory 104 may be programmable to a state (e.g., a threshold voltage in a flash configuration or a resistive state in a resistive memory configuration) that indicates one or more values. For example, the memory 104 may be configured to store data 106. Each block of the memory 104 may include one or more word lines. Each word line may include one or more pages, such as one or more physical pages. In some implementations, each page may be configured to store a codeword. A word line may be configurable to operate as a single-level-cell (SLC) word line, as a multi-level-cell (MLC) word line, or as a tri-level-cell (TLC) word line, as illustrative, non-limiting examples.

The memory device 103 may include support circuitry, such as read/write circuitry 105, to support operation of one or more memory dies of the memory device 103. For example, the read/write circuitry 105 may include one or more buffers, drivers, or other circuitry used to perform read operations, write operations, or both, at the memory device 103. Although depicted as a single component, the read/write circuitry 105 may be divided into separate components of the memory device 103, such as read circuitry and write circuitry. The read/write circuitry 105 may be external to the one or more dies of the memory device 103. Alternatively, one or more individual memory dies of the memory device 103 may include corresponding read/write circuitry that is operable to read data from and/or write data to storage elements within the individual memory die independent of any other read and/or write operations at any of the other memory dies.

The data storage device 102 also includes a controller 120 that is coupled to the memory device 103 via a bus 110, an interface (e.g., interface circuitry, such as a memory interface 122), another structure, or a combination thereof. For example, the bus 110 may include one or more channels to enable the controller 120 to communicate with a single memory die of the memory device 103. As another example, the bus 110 may include multiple distinct channels to enable the controller 120 to communicate with each memory die of the memory device 103 in parallel with, and independently of, communication with other memory dies of the memory device 103.

The controller 120 is configured to receive data and instructions from the access device 150 and to send data to the access device 150. For example, the controller 120 may send data to the access device 150 via the access interface 124, and the controller 120 may receive data from the access device 150 via the access interface 124. The controller 120 is configured to send data and commands to the memory 104 and to receive data from the memory 104. For example, the controller 120 is configured to send data and a write command to cause the memory 104 to store data to a specified address of the memory 104. The write command may specify a physical address of a portion of the memory 104 (e.g., a physical address of a word line of the memory 104) that is to store the data. The controller 120 is also configured to send a read command to the memory 104 to cause read data to be sent from the memory 104 to the controller 120. The read command may specify a physical address of a portion of the memory 104 (e.g., a physical address of a word line of the memory 104). The controller 120 may also be configured to send data and commands to the memory 104 associated with background scanning operations, garbage collection operations, wear leveling operations, relocation operations, etc., as illustrative, non-limiting examples.

The controller 120 includes memory management circuitry 162 (e.g., first circuitry), access device management circuitry 164 (e.g., second circuitry), and an error correction code (ECC) engine 166. The memory management circuitry 162 may include a processor, an application-specific integrated circuit (ASIC), a field-programmable gate array (FPGA), other circuitry, or a combination thereof, that is configured to communicate with the memory device 103 or the memory 104. For example, the memory management circuitry 162 may be configured to execute one or more processing threads, such as an illustrative first processing thread 163, to facilitate communications between the access device 150 and the memory device 103 or the memory 104.

To illustrate, the memory management circuitry 162 may receive a read request from the access device 150. The read request may specify a logical address of data determined by the access device 150. In order to access the data at the memory 104, the memory management circuitry 162 may access mapping data, such as logical-to-physical address translation data or Flash translation layer (FTL) mapping data, to determine a physical address of the data at the memory 104. Because the mapping data is frequently accessed (e.g., to perform address translations for read operations and write operations), storing the mapping data at a location that has a lower access latency may improve operation of the data storage device 102. As an example, storing the mapping data at a volatile memory, such as a DRAM, a cache, a buffer, etc., may improve the performance of the data storage device 102.

However, including such a memory within a data storage device increases size and cost of the data storage device. To reduce the size and cost of the data storage device 102, the data storage device 102 may be configured to store frequently accessed data, such as mapping data, at the HMB 151 of the access device 150. In order to access the mapping data, the memory management circuitry 162 may be configured to generate a data request 176. The data request 176 may include an address 178 (e.g., an address of particular mapping data) and a first identifier 179. The first identifier 179 may be associated with and may identify the component or element of the data storage device 102 that generated the data request 176. For example, the first identifier 179 may be associated with the memory management circuitry 162 or the first processing thread 163. To illustrate, the memory management circuitry 162 or the first processing thread 163 may initiate generation of the data request 176.

The controller 120 also includes the access device management circuitry 164. The access device management circuitry 164 may include a processor, an ASIC, a FPGA, other circuitry, or a combination thereof, that is configured to communicate with the access device 150. For example, the access device management circuitry 164 may be configured to receive data and instructions from the access device 150 and to provide data and to issue requests and other messages to the access device 150.

The access device management circuitry 164 may be configured to retrieve data and metadata associated with the data from the HMB 151 of the access device 150 based on the data request 176. For example, the access device management circuitry 164 may be configured to receive the data request 176 from the memory management circuitry 162 and to generate a read request 156 that requests data associated with the address 178. The HMB 151 may store data and metadata associated with the data, such as data 153 and metadata 154 that is associated with the data 153. Pairs of data and corresponding metadata may be interleaved at the HMB 151 according to one or more of a variety of layouts, as further described with reference to FIG. 2.

The metadata 154 may include ECC data, cyclical redundancy check (CRC) data, or a combination thereof. The metadata 154 also includes a second identifier 147. The second identifier 147 may be associated with and may identify a component or element of the data storage device 102 that caused the data 153 to be stored at the HMB 151. As a particular example, the second identifier 147 may include a pool tag. In a particular implementation, the metadata 154 includes 8 bytes that include ECC data, CRC data, and the second identifier 147.

The access device 150 may be configured to send the data 153 and the metadata 154 to the data storage device 102 based on receiving the read request 156. For example, the HMB 151 may operate as a cache, and the access device 150 may be configured to access the HMB 151 using the address 178 and to return the data 153 and the metadata 154 in response to the address 178 (or a portion thereof) matching an address (or a portion thereof) associated with the data 153. The access device 150 may be configured to send the data 153 and the metadata 154 to the data storage device 102 as one or more data packets 155.

The data storage device (e.g., the access interface 124) may be configured to receive the one or more data packets 155 (including the data 153 and the metadata 154) from the access device 150. The access device management circuitry 164 (e.g., the second circuitry) may be configured to provide at least a portion of the data 153 to the memory management circuitry 162 (e.g., the first circuitry) in response to determining that the first identifier 179 matches the second identifier 147 (e.g., are the same). For example, the first identifier 179 and the second identifier 147 may have the same value. As another example, the first identifier 179 and the second identifier 147 may correspond to the same process or device (or component thereof).

To illustrate, the access device management circuitry 164 may include access interface manager 172. The access interface manager 172 may include circuitry or other components that are configured to cause the data storage device 102 to communicate with the access device 150. For example, the access interface manager 172 may generate the read request 156 and may receive the one or more data packets 155.

The access device management circuitry 164 may also include a data integrity manager 170. The data integrity manager 170 may include circuitry or other components that are configured to compare identifiers to verify data integrity (e.g., that data retrieved from the HMB 151 is associated with the same identifier as the corresponding data request). The data integrity manager 170 may include a comparator or other components that enable the data integrity manager 170 to compare identifiers. For example, the data integrity manager 170 may be configured to compare the first identifier 179 and the second identifier 147. The data integrity manager 170 may be configured to provide at least a portion of the data 153 to the memory management circuitry 162 in response to a determination that the first identifier 179 and the second identifier 147 are the same. The data integrity manager 170 may be further configured to prevent the data 153 from being provided to the memory management circuitry 162 in response to a determination that the first identifier 179 and the second identifier 147 are not the same. Additionally, the access device management circuitry 164 may be configured to perform one or more data recovery operations and to send an error notification to the access device 150 in response to a determination that the first identifier 179 and the second identifier 147 are not the same.

The access device management circuitry 164 may also be configured to maintain one or more queues 174. Instructions, such as data requests or other instructions, may be stored in the one or more queues 174 for processing by the data integrity manager 170 or the access interface manager 172. In a particular implementation, each queue of the one or more queues 174 corresponds to one of the processing threads or components of the data storage device 102 that communicate with the access device management circuitry 164.

The controller 120 also includes the ECC engine 166 that is configured to receive data to be stored at the memory 104 and to generate a codeword. For example, the ECC engine 166 may include an encoder configured to encode data using an ECC scheme, such as a Reed-Solomon encoder, a Bose-Chaudhuri-Hocquenghem (BCH) encoder, a low-density parity check (LDPC) encoder, a Turbo Code encoder, an encoder configured to encode one or more other ECC encoding schemes, or a combination thereof, as illustrative, non-limiting examples. The codeword may be sent from the controller 120 to the memory device 103 and stored at the memory 104.

The ECC engine 166 may also be configured to receive data and to process the received data in accordance with one or more ECC decoding schemes. For example, the ECC engine 166 may include an ECC decoder, such as a Reed Solomon decoder, a BCH decoder, an LDPC decoder, a Turbo Code decoder, a decoder configured to decode received data in accordance with one or more other ECC encoding schemes, or any combination thereof. The ECC engine 166 may be configured to decode data read from the memory 104 to detect and correct, up to an error correction capability of the ECC scheme, any bit errors that may be present in the data. In some implementations, the ECC engine 166 may be configured to perform single error correct, multiple error detect decoding based on a cyclic code, such as a BCH code. For example, the ECC engine 166 may be configured to detect up to ten errors and to correct up to one error based on the cyclic code, as further described herein.

During operation, memory management circuitry 162 may initiate an operation that uses data stored at the HMB 151. For example, the first processing thread 163 executing at the memory management circuitry 162 may initiate an address translation operation. In response to initiation of the operation, the memory management circuitry 162 may generate and send the data request 176 to the access device management circuitry 164. The data request 176 may include the address 178 of the requested data and the first identifier 179 that is associated with the memory management circuitry 162 (or the first processing thread 163).

The access device management circuitry 164 may generate the read request 156 based on the data request 176. The read request 156 may include the address 178, a portion of the address 178, or a value that is based on the address 178, such as a tag value. The access interface manager 172 may send the read request 156 to the access device 150 via the access interface 124 and the communication path 126. The access interface manager 172 may control communications with the access device 150 so that the communications are in accordance with one or more industry standards. For example, the access interface manager 172 may cause the data storage device 102 to communicate with the access device 150 in accordance with a peripheral component interconnect express (PCIe) standard.

The access device 150 may access the HMB 151 in the memory 149 based on the read request 156. For example, the access device 150 may determine whether data in the HMB 151 is associated with an address (or a portion thereof) that matches the address 178 (or a portion thereof). In response to determining that the data 153 is associated with a matching address, the access device 150 retrieves the data 153 and the metadata 154 associated with the data 153 from the HMB 151. The metadata 154 may include additional ECC data, additional CRC data, the second identifier 147, or a combination thereof. The access device 150 may include the data 153 and the metadata 154 in the one or more data packets 155 that are sent to the data storage device 102. In some implementations, a first packet of the one or more data packets 155 may include the data 153, and a second packet of the one or more data packets 155 may include the metadata 154. In other implementations, a single packet may include a portion of the data 153 and the metadata 154.

The access device management circuitry 164 may receive the data 153 and the metadata 154. The data integrity manager 170 of the access device management circuitry 164 may compare the second identifier 147 to the first identifier 179. Based on a determination that the second identifier 147 and the first identifier 179 are the same, the data integrity manager 170 may cause at least a portion of the data 153 to be provided to the memory management circuitry 162 for use in performing the operation initiated at the memory management circuitry 162. In a particular implementation, the memory management circuitry 162 may perform operations using a higher address resolution than the access device 150. As a particular example, the HMB 151 may store data in 8-byte chunks or pages, but the memory management circuitry 162 may operate on data in 4-byte chunks or pages. In this implementation, the access device management circuitry 164 may ignore one or more bits (e.g., a least significant bit) of the address 178 when generating the read request 156, and after the data integrity manager 170 verifies the integrity of the data 153, the access device management circuitry 164 may provide a particular portion (e.g., a 4-byte page of the retrieved 8-byte page) of the data 153 to the memory management circuitry 162 based on the one or more bits of the address 178. In other implementations, other data page sizes and address resolutions may be used. Prior to providing at least a portion of the data 153 to the memory management circuitry 162, the data 153 (or the portion thereof) may be ECC decoded by the ECC engine 166. In a particular implementation, the ECC engine 166 performs single error correct, multiple error detect (SEC-MED) decoding on the data 153 prior to the data 153 being provided to the memory management circuitry 162.

Based on a determination that the second identifier 147 and the first identifier 179 are different, the access device management circuitry 164 may initiate one or more data recovery actions. For example, the requested data may be redundantly stored at the memory 104, and the access device management circuitry 164 may retrieve the requested data from the memory 104. Additionally or alternatively, the access device management circuitry 164 may send an error notification 157 to the access device 150. The error notification 157 may indicate that data stored at the HMB 151 is corrupted, and the access device 150 may perform one or more data recovery actions to repair the data.

In a particular implementation, the error notification 157 may include a pool tag 158. To illustrate, in systems that execute a Microsoft® Windows® operating system (trademarks of Microsoft Corporation, Redmond, Wash.), an entity (e.g., a driver) may request allocation of a block of memory. The operating system may associate a pool tag and a pool size with the allocated block of memory. The pool tag may be a 4-byte identifier of the entity that requested allocation of the block of memory. If a portion of data stored at the HMB 151 is overwritten due to improper allocation of a memory block within the HMB 151, the pool tag may identify the entity that caused the overwriting and a size of the corrupted data. In other implementations, the error notification 157 may include a different form of identifier associated with an entity caused overwriting of data at the HMB 151. Additionally or alternatively, the error notification 157 may include a range 159 of the corrupted data. For example, the range 159 may indicate the size of the improperly allocated memory. In other implementations, the access device 150 may perform a periodic scan to verify and recover data stored at the HMB 151, as further described with reference to FIG. 3.

In a particular implementation, a second processing thread may generate additional data for storage at the HMB 151. The access device management circuitry 164 may receive a write command that includes the additional data and a third identifier that is associated with the second processing thread. The access device management circuitry 164 may generate second metadata that includes the third identifier. The access device management circuitry 164 may send a write command that includes the additional data and the second metadata to the access device 150. The access device 150 may store the additional data and the second metadata at the HMB 151 in a manner that indicates that the second metadata is associated with the additional data.

Thus, the data storage device 102 may store data, such as frequently used data, at a volatile memory of the access device 150. Because the data storage device 102 is able to store the data externally, the controller 120 can perform memory caching operations without the presence of a volatile memory (or using a volatile memory of reduced size) within the controller 120. Accordingly, the data storage device 102 has a smaller size and reduced cost as compared to data storage devices that include a volatile memory within a controller. Additionally, the data storage device 102 may verify the integrity of data retrieved from the HMB 151 (e.g., verify that the data stored at the HMB 151 by the data storage device 102 has not been modified or overwritten). For example, the data storage device 102 may determine whether data is valid based on a comparison of an identifier within retrieved metadata and an identifier associated with a data request. Verifying data integrity may be a component of compliance with one or more non-volatile memory standards.

Figure 2:
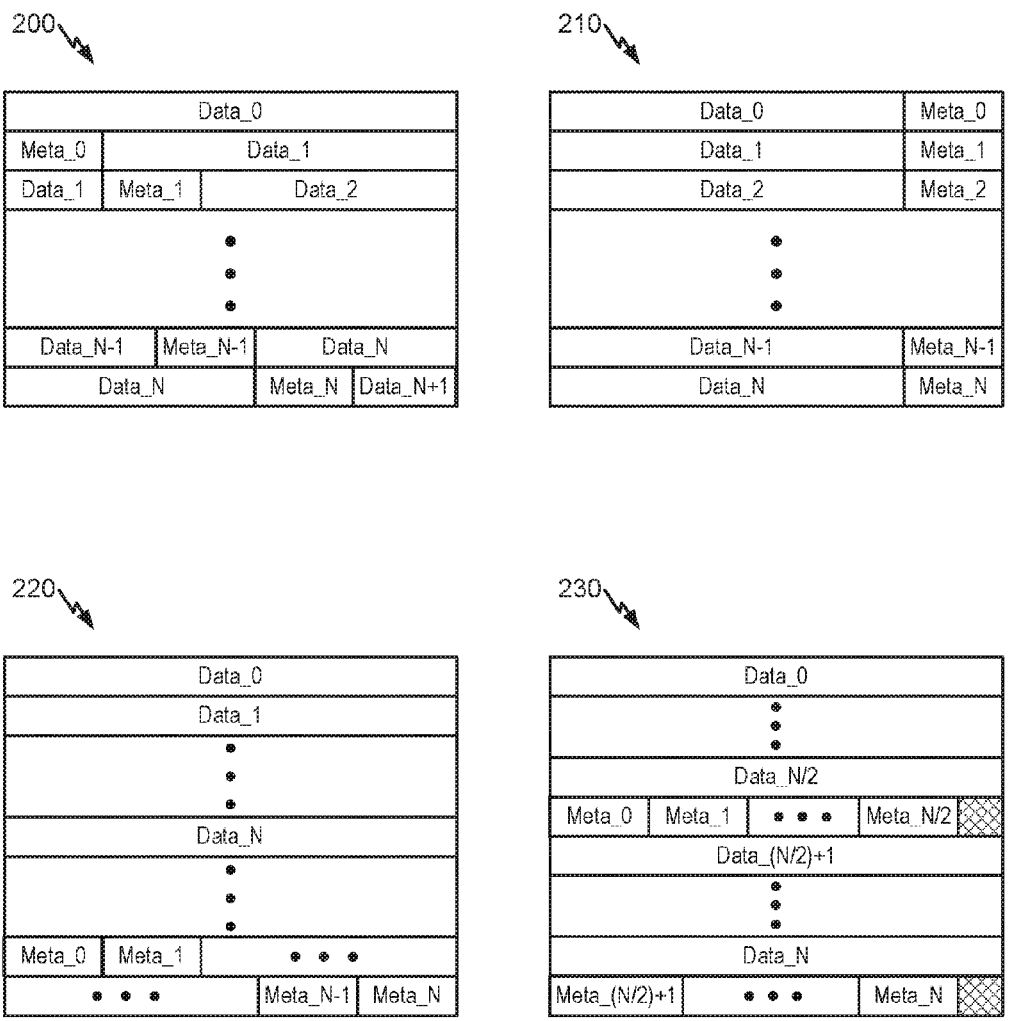
FIG. 2 is a diagram of illustrative examples of layouts for storing data and metadata at a memory of an access device.

Referring to FIG. 2, a diagram of illustrative examples of layouts for storing data and metadata at a memory of an access device is shown. In a particular implementation, data and metadata may be stored according to the examples illustrated in FIG. 2 at a volatile memory of the access device, such as at the HMB 151 of the access device 150 of FIG. 1.

FIG. 2 illustrates a first layout 200. Each row in the first layout 200 represents a particular size (e.g., a size of a payload of a data packet). In a particular implementation, the particular size is 128 bytes. In accordance with the first layout 200, pairs of data and corresponding metadata are stored in an interleaved manner at the volatile memory. For example, first metadata (Meta_0) that is associated with first data (Data_0) is stored after the first data, second data (Data_1) is stored after the first metadata, and second metadata (Meta_1) that is associated with the second data is stored after the second data.

In the first layout 200, data chunks include 128 bytes of data and metadata chunks include 8 bytes of metadata. In some instances, a maximum size of a transport layer packet (TLP) (e.g., one of the one or more data packets 155 of FIG. 1) specified by the access device and used by the data storage device is 128 bytes. In these instances, data and the corresponding metadata may be retrieved from the volatile memory using two TLPs. In other instances, the maximum size of the TLP is more than 128 bytes, and data and the corresponding metadata may be retrieved from the volatile memory using a single TLP (e.g., the access device may construct a single frame that includes the data and the metadata, and the frame may be included in one TLP). Retrieving data and the corresponding metadata using a single TLP improves speed and efficiency of the retrieval process as compared to retrieving the data and the corresponding metadata using multiple TLPs. Thus, the first layout 200 may improve speed and efficiency of a data storage device in instances that the maximum TLP size equals or exceeds the size of a combination of a data chunk and a corresponding metadata chunk.

FIG. 2 also illustrates a second layout 210. In accordance with the second layout 210, pairs of data and corresponding metadata are stored in an interleaved manner at the volatile memory, similar to the first layout 200. However, in the second layout 210, a size of a pair of data and corresponding metadata fails to exceed a maximum size of a TLP. For example, the data chunks may include 120 bytes of data and metadata chunks may include 8 bytes of metadata, such that a pair of data and corresponding data has a size of 128 bytes, which fails to exceed a maximum size of a TLP (e.g., 128 bytes). Thus, a pair of data and corresponding metadata may be retrieved from the volatile memory using a single TLP, which may improve speed and efficiency of the retrieval process as compared to retrieving the data and the corresponding metadata using multiple TLPs. Thus, the second layout 210 may improve speed and efficiency of a data storage device. However, because data is stored as data chunks having a smaller size than the maximum size of a TLP, the data chunks may be a different size than is used by other applications.

FIG. 2 also illustrates a third layout 220. In accordance with the third layout 220, pairs of blocks of data and corresponding blocks of metadata are stored at non-continuous locations at the volatile memory. For example, first data (Data_0), second data (Data_1), and Nth data (Data_N) may be stored in a continuous manner at a first location, and first metadata (Meta_0) that is associated with the first data, second metadata (Meta_1) that is associated with the second data, and Nth metadata (Meta_N) that is associated with the Nth data may be stored in a continuous manner at a second location. In a particular implementation, the first location includes a first buffer and the second location includes a second buffer.

In the third layout 220, each data chunk may have the same size as the maximum size of a TLP. Thus, data transfers to and from the volatile memory are aligned, which may improve performance at the volatile memory, at the access interface of the data storage device, and at internal buses of the access device and the data storage device. Additionally, each data chunk has a size that is commonly used by many applications. Additionally, because the data and metadata are stored at different locations, a debug process may be less complex than if data and metadata are interleaved. However, dynamic memory resizing when data and metadata are stored at different locations may be more difficult.

FIG. 2 also illustrates a fourth layout 230. In accordance with the fourth layout 230, blocks of data and blocks of metadata are stored in an interleaved manner at the volatile memory. To illustrate, a first block of data may include first data (Data_0)–(N/2)th data (Data_N/2). Metadata associated with a first block of data may be stored after the first block of data at the volatile memory. For example, first metadata (Meta_0) that is associated with the first data, second metadata (Meta_1) that is associated with second data, and (N/2)th metadata (Meta_N/2) that is associated with the (N/2)th data may be stored after the (N/2)th data chunk. (N/2+1)th data to Nth data may be stored in a continuous manner following the (N/2)th metadata, and (N/2+1)th metadata to Nth metadata may be stored in a continuous manner following the Nth data. A pair of a block of data and a block of metadata may be prefetched and stored in a memory, such as a buffer, using a prefetch operation. In a particular implementation, each pair of a block of data and a block of metadata includes 2 kilobytes.

The fourth layout 230 may reduce overhead and latency of an access device because a likelihood of both a particular data chunk and the corresponding metadata chunk being prefetched at the volatile memory is improved, as compared to the third layout 220. For example, in response to receiving a request for data, the access device may prefetch a block of data that includes the requested data from the HMB. For example, the access device may prefetch the block of memory and store the block of memory in a buffer (e.g., a cache). Because zones of data and the corresponding metadata are interleaved, metadata corresponding to the requested data will likely be prefetched into the buffer. Because the metadata and the data are retrieved from the HMB using one prefetch operation, a number of retrieval operations at the HMB may be reduced, thereby reducing the overall latency of the access device.

Figure 3:
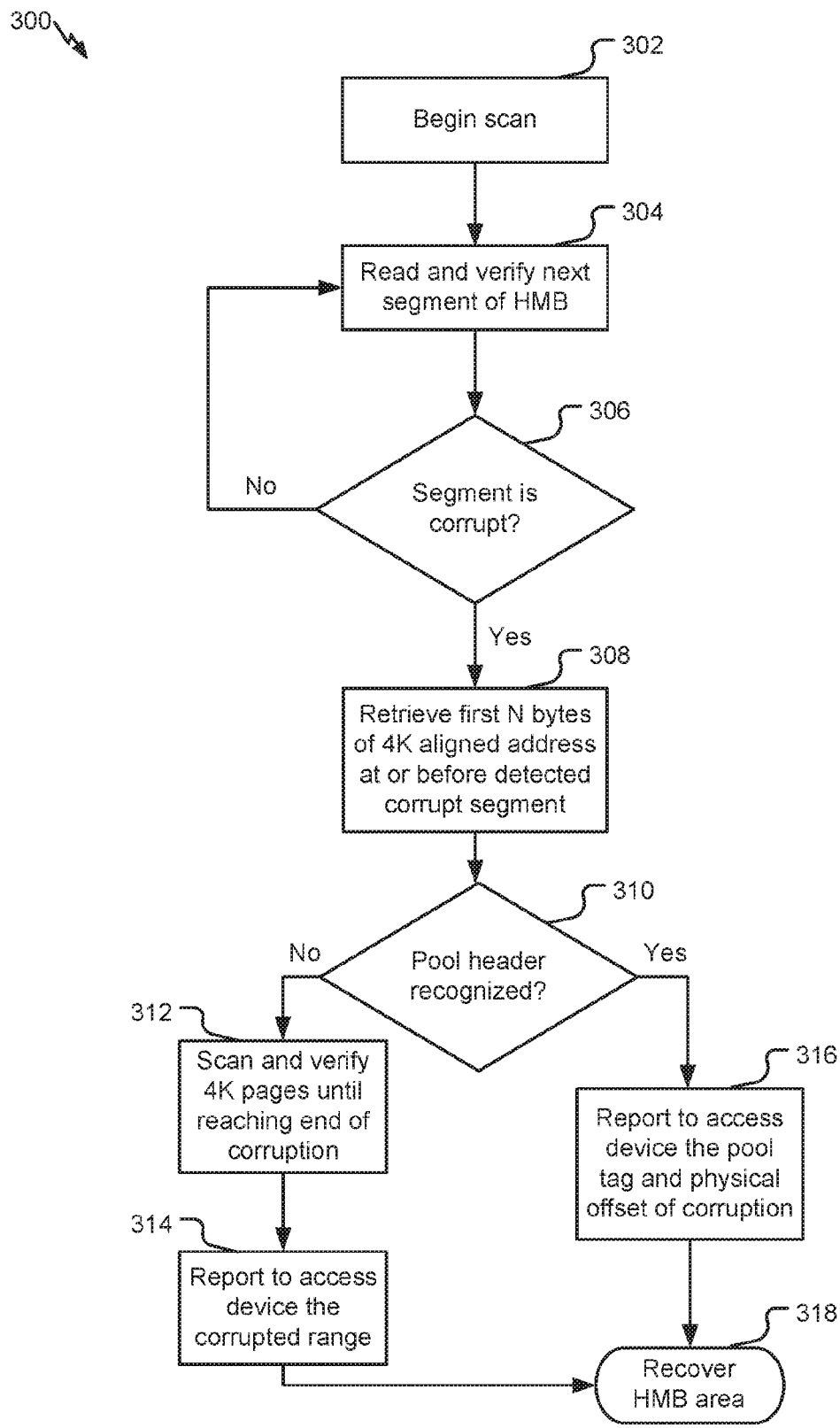
FIG. 3 is a flow diagram that illustrates an example of a method of verifying and recovering data stored at a volatile memory of an access device.

Referring to FIG. 3, a particular example of a method 300 of verifying and recovering data stored at a volatile memory of an access device is shown. The method 300 may be performed at a data storage device, such as at the controller 120 of the data storage device 102 of FIG. 1. The method 300 may verify and recover data stored at a volatile memory (e.g., a HMB) of an access device, such as at the HMB 151 of the access device 150 of FIG. 1.

The scan begins, at 302. The scan may be a passive scan that is performed by a controller of a data storage device when the controller is in an idle state. Additionally or alternatively, the scan may be performed in response to an asynchronous event that indicates a memory corruption.

A segment of data stored at the HMB is retrieved, at 304. The amount of data retrieved may be the same as a page size used by the data storage device. In some implementations, the page size used by the data storage device may differ from a page size used by the HMB.

Additionally, the controller begins verification of the retrieved data, at 304. For example, the controller may generate metadata based on the retrieved data and an identifier of an expected component that caused the retrieved data to be stored at the HMB. Generating the metadata may also include generating ECC data, CRC data, or both based on the retrieved data. The controller detects whether the retrieved data is corrupt, at 306. For example, the controller may compare the generated metadata to metadata included in the retrieved data. If the generated metadata matches the retrieved metadata, no error is detected and the method 300 returns to 304. If the generated metadata does not match the retrieved metadata, corrupt data (e.g., an error) is detected, and the method 300 continues to 308.

After detecting a corrupt data segment, the controller retrieves from the HMB the first N bytes of a 4 kilobyte (KB) address at or before the corrupt data segment, at 308. For example, if the HMB stores data in 8 KB pages, and the data storage device retrieves data in 4 KB pages, the controller may retrieve the prior 4 KB segment of data based on detecting an error in the current 4 KB segment of data. In other implementations, other sizes of pages may be used by the data storage device and the HMB.

The controller determines whether a pool header is recognized within the corrupted data segment (or the prior data segment), at 310. To illustrate, the HMB may be part of an access device that operates a Microsoft® Windows® operating system. The operating system may specify that, when memory is dynamically allocated to a program or an operating system, a pool header (e.g., a header region) is to be stored in the first N bytes of the dynamically allocated memory. The pool header may include a pool tag (e.g., identification data) identifying the program or operating system that requested the allocation of memory and an offset (e.g., a range) of the allocated memory. The controller may determine whether the first N bytes of the corrupt data segment include a pool header. Additionally, the controller may determine whether the first N bytes of the previous data segment include a pool header in case the corrupt data segment is a portion of a larger memory page at the HMB (e.g., in case the 4 KB page retrieved by the controller is the second half of an 8 KB memory page at the HMB). If a pool header is identified within either of the data segments, the controller may examine the pool header to determine the source of the program or operating system that last stored data in the HMB.

If no pool header is detected, the method 300 continues to 312, where the controller scans and verifies data segments (e.g., 4 KB pages of data) from the HMB until an uncorrupted data segment is identified. For example, the controller may iteratively retrieve a data segment from the HMB and determine whether the data segment is corrupt until the controller detects an uncorrupted data segment. The controller reports the corrupted range of data to the access device, at 314. If the controller is able to identify a pool header at 310, the method continues to 316, where the controller reports the pool tag and an offset of the corrupted data to the access device. For example, the controller may identify the pool tag and the offset information within the pool header, and the controller may send a message that indicates the pool tag and the offset to the access device. Although the method 300 has been described with respect to identifying pool headers and pool tags, in other implementations, different identifying information may be identified and used to determine a source that last stored data at the HMB and a range of corrupted data.

After reporting the range of corrupted data, at 314, or reporting the pool tag and the offset, at 316, the method 300 continues to 318. The controller initiates recovery of the corrupted data at the HMB, at 318. For example, a redundant copy of data stored at the HMB may be stored at a non-volatile memory of the data storage device. The controller may cause the redundant data from the non-volatile memory to be retrieved and stored at the HMB to re-initialize the HMB.

Thus, the method 300 may enable a data storage device to identify and recover corrupt data stored at a volatile memory of an access device. Recovering the corrupt data before the corrupt data is used may improve performance of the data storage device. Additionally, by providing information (e.g., a pool tag) to the access device, the data storage device may assist the access device in identifying a source of the error and preventing future errors caused by the source.

Figure 4:
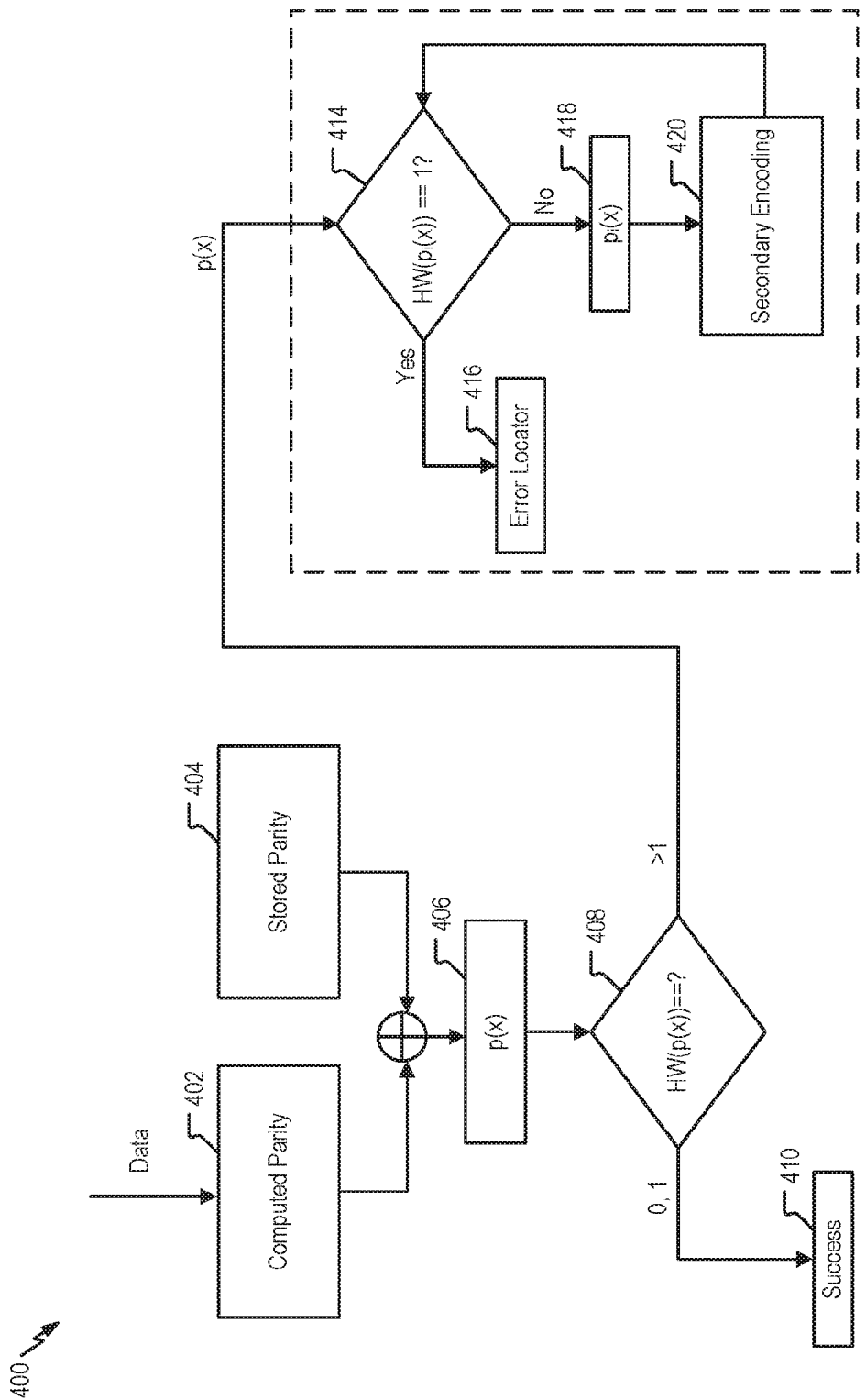
FIG. 4 is a flow diagram that illustrates an example of a method of decoding data.

Referring to FIG. 4, a particular example of a method 400 of decoding data is shown. The method 400 may be performed by an ECC decoder or an ECC engine, such as the ECC engine 166 of FIG. 1.

The method 400 may be used to decode an ECC codeword that is encoded using a cyclic code. The ECC codeword may include an information section (e.g., information symbols or data), a parity section (e.g., parity symbols or parity data), and a shortening section (e.g., one or more additional information symbols that may be removed before the codeword is stored or during decoding of the codeword). A cyclic code is a code of length N that is generated by a generator polynomial $g(x)$ such that $g(x)$ divides $x^N+1$ if computations are performed in "characteristic 2" (e.g., if the computations are performed on a finite field and the characteristic of the finite field is 2). An ECC codeword of length N may be represented by two different representations: one representation as a vector $c^T=(c_0, c_1, c_{N-2}, c_{N-1})$, and the other representation as a polynomial $c(x)=c_0 x^{N-1}+c_1 x^{N-2}+ \ldots +c_{N-2}x+c_{N-1}$. Using the polynomial representation, in view of the generator polynomial $g(x)$ being able to divide $x^N+1$, any cyclic rotation of an ECC codeword that is encoded using a cyclic ECC code is also an ECC codeword. For example, if the above codeword is rotated by one to the left, the resulting vector $(c_1, c_2, \ldots, c_{N-1}, c_0)$ is also an ECC codeword.

A degree constrained encoding of any polynomial $m(x)$ is a polynomial $p(x)$ satisfying $\deg(p(x))<\deg(g(x))$ (e.g., the degree of $p(x)$ is less than the degree of the generator polynomial), such that $m(x)+p(x)=0 \mod(g(x))$ (i.e., such that $m(x)+p(x)$ is a polynomial representation of an ECC codeword). A systematic encoding of a polynomial $m(x)$ is a degree constrained encoding of $x^{\deg(g(x))}m(x)$. A decoding of any polynomial $d(x)$ is a polynomial $e(x)$ that has the fewest number of non-zero elements (e.g., has the "minimal weight") and that satisfies $d(x)+e(x)=0 \mod(g(x))$ (i.e., $d(x)+e(x)$ is a polynomial representation of an ECC codeword). Additionally, a polynomial representation of a codeword $c(x)$ may be partitioned into two polynomials, $c_1(x)$ and $c_2(x)$, that satisfy $c(x)=c_1(x) c_2(x)$. However, the two polynomials $c_1(x)$ and $c_2(x)$ may not be codewords (e.g., ECC codewords). If a codeword is partitioned in such a manner, any encoding (or decoding) polynomial $p(x)$ of $c_1(x)$ is also an encoding (or decoding) polynomial of $c_2(x)$.

Based on the foregoing, if $d(x)$ is a polynomial representation of a received codeword having an error pattern that is represented by an error polynomial $err(x)$, (i.e. $d(x)=c(x)+err(x)$, where $c(x)$ is the uncorrupted codeword) then $d(x)$ can be encoded by a degree constrained encoding to receive the polynomial $p(x)$ that satisfies $[c(x)+err(x)]+p(x)=0 \mod (g(x))$. Because $c(x)=0 \mod(g(x))$, it follows that $err(x)+p(x)=0 \mod(g(x))$. Since $err(x)+p(x)$ is a valid codeword, and since the ECC code is a cyclic code, any rotation of the form $x^{-l}[err(x)+p(x)] \mod(x^N+1)$ is also a valid ECC codeword. At this point $err(x)$ is unknown (e.g., has not been determined), however $p(x)$ is known (e.g., has been determined or is determinable) since $d(x)$ is known and since $p(x)$ is an encoding of $d(x)$. To decode a codeword with a single error, $p(x)$ may be generated using degree constrained encoding and rotated. The rotated version of $p(x)$ is $x^{-l}p(x) \mod(x^N+1)$. For simplification, the rotated version of $p(x)$ is represented as $x^{-l}p(x)$ (e.g., the $\mod(x^N+1)$ is omitted). The rotated version of $p(x)$ maybe encoded using degree constrained encoding. If $d(x)$ contains only one error at location a, (i.e. $err(x)=x^a$), then when $l>a-\deg(g(x))$, the degree of $x^{-l}err(x)=x^{a-l}$ is smaller than $\deg(g(x))$, thus for each value of l determined in accordance with the foregoing technique, $x^{a-l}$ is the degree constrained encoding of $x^l p(x)$ such that $x^{a-l}$ coincides with the decoding of $x^{-l}p(x)$ and is equal to $x^{-l}err(x)$. The decoding may end at this point, and $err(x)$ may be reconstructed from the values of l and the position of the non-zero coefficient of $x^{-l}err(x)$. If $err(x)$ contains more than one error but less than d−1 errors, where d is a "minimal distance" of the code (e.g., a smallest distance between codewords), then for any rotation $x^{-l}p(x)$ of $p(x)$, the degree constrained encoding of $x^{-l}p(x)$ contains more than 1 coefficient. In response to detecting more than 1 coefficient for each rotation, the decoder may detect an uncorrectable error.

To illustrate, the method 400 includes receiving data (e.g., reading data stored at a memory) and encoding the received data to generate a computed encoding, at 402. For example, the received data may be encoded using a degree constrained encoding. Encoding the received data bits generates parity bits (e.g., "computed parity bits"). The method 400 includes receiving a stored parity (e.g., an encoding), at 404. For example, the data that is used to generate the computed encoding may also be stored at a memory. The stored parity includes "stored parity bits." The method 400 includes combining the computed parity bits and the stored parity bits (e.g., by performing an exclusive- or (XOR) operation) to generate a parity word $p(x)$, at 406.

The method 400 includes determining a weight of the parity word $p(x)$, at 408. For example, a Hamming weight of the parity word $p(x)$ (e.g., $HW(p(x))$) may be determined. The Hamming weight of the parity word $p(x)$ indicates the number of bits of the parity word $p(x)$ that have a value that is different than a logical zero value. If the Hamming weight is 0, it is determined that there are no errors in the stored data that is used to generate the computed encoding and no errors in the stored parity, (e.g., the computed parity bits match the received parity bits) and that the decoding is a success. If the Hamming weight is 1, (i.e. $p(x)=x^a$ for some integer a), it is determined that there are no errors in the stored data that is used to generate the computed encoding and that there is a single error at location a in the stored parity. Since this error is not in the data (e.g., the data section of the stored data), the received codeword may be successfully decoded. The received codeword is successfully decoded (and the single error in the parity (if present) may either be corrected or ignored) at 410

If the Hamming weight is a value that is greater than 1, the parity word may be rotated to identify a correctable error. To illustrate, the method 400 includes determining whether the Hamming weight of a current parity word is equal to 1, at 414. If the Hamming weight of the current parity word is equal to 1, there is a single error within the parity section of the current codeword, and the method 400 continues to 416, where the error is located. In some implementations, the error is also corrected. If the Hamming weight of the current parity word is not equal to 1, the method 400 includes rotating the current parity word to generate a rotated parity word $p_t(x)$, at 418. A particular rotation may be applied to the current parity word. As one example, the particular rotation may be a predetermined value, such as a left rotation by 1. As another example, the particular rotation may be a calculated value, such as a rotation by ord(g(x)) (e.g., $x^{ord(g(x))}p(x)$ is rotated to generate $p_t(x)$). Rotating the parity word by ord(g(x)) may cause an error to be identified more quickly. The method 400 continues to 420, where the current parity word (e.g., the rotated parity word $p_t(x)$) may be encoded based on a degree constrained encoding. The method 400 then returns to 414, where the Hamming weight of the current parity word (e.g., the encoded, rotated parity word) is determined. In this manner, the current parity word may be iteratively rotated until a parity word having a Hamming weight of 1 is detected.

The method 400 enables an ECC engine or ECC decoder to detect multiple errors and to correct a single error. For example, a codeword that indicates the parity of a received error may be rotated until a single correctable error is detected, and the error may be corrected. Additionally, based on the Hamming weight, multiple errors may be detected. The decoder may deterministically detect all error patterns whose weight is less than d-1, where d is the minimal distance of the corresponding ECC code. Additionally, by generating ECC codewords using cyclic codes with large minimal distance and by detecting errors by rotating codewords, the ECC codewords may also operate to provide CRC functionality. Thus, ECC functionality and CRC functionality may be provided by a single code, such as a BCH code.

Figure 5:
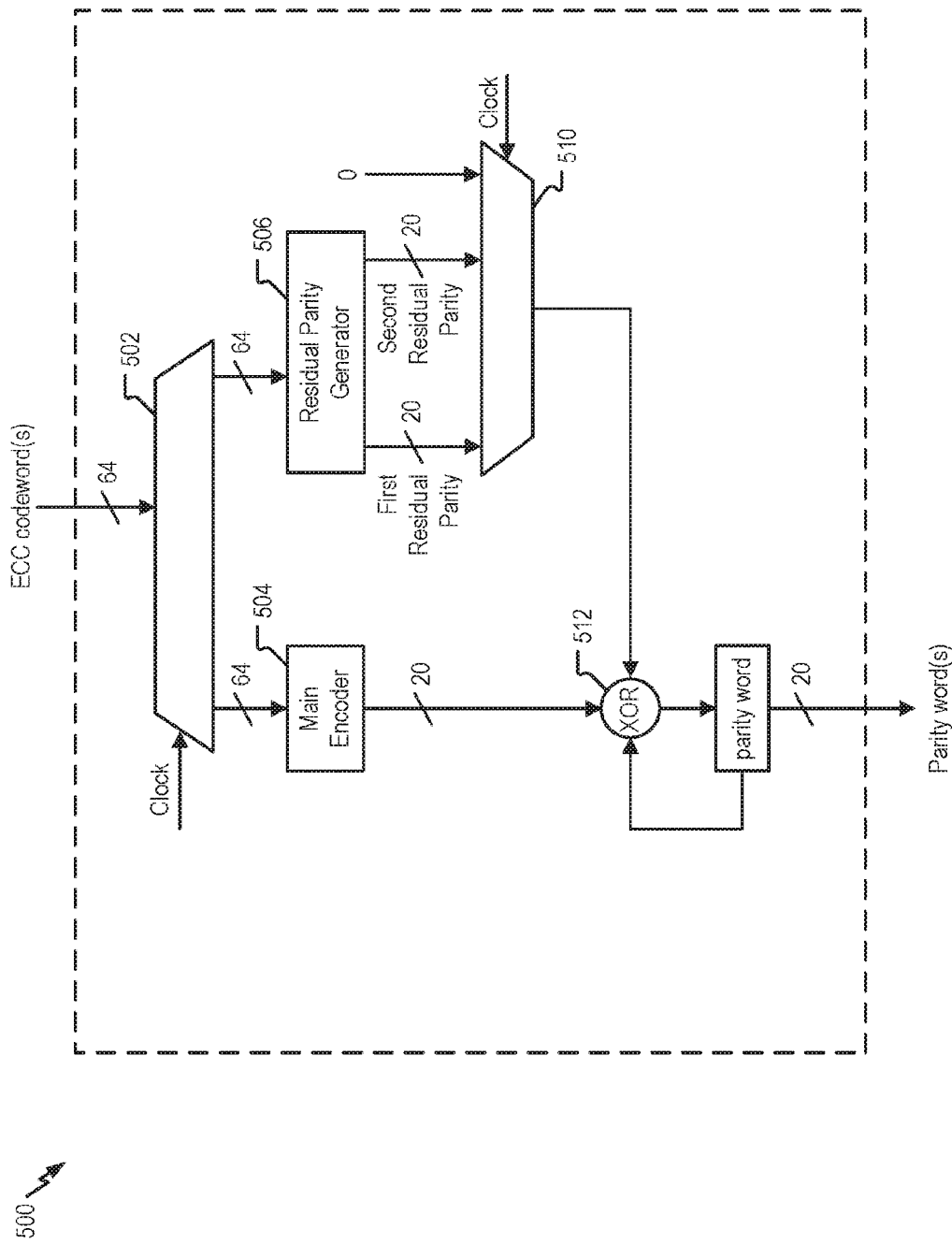
FIG. 5 is a block diagram of a first illustrative example of a decoder.

Referring to FIG. 5, an illustrative example of a portion of an ECC engine is shown and generally designated 500. In a particular implementation, the ECC engine 500 may be included in or correspond to the ECC engine 166 of FIG. 1. In many applications, the length of the codeword may not be an integer multiple of a width of a bus (a "bus width") of the data storage device. For example, the bus width (i.e., the number of bits received in parallel at each clock cycle) may be 64 bits and the codeword length may be 224 bits (i.e., 64*3.5). To illustrate, the codeword may contain 192 (i.e., 3*64) information bits, 12 tag data bits, and 20 parity bits. Computation of the parity word p(x) associated with such a codeword may take 4 clock cycles. To illustrate, 64 bits of the codeword may be received during each of the first 3 clock cycles and their contribution to the parity word may be computed. However, only 32 bits may be received during the 4th clock cycle. Thus, parity words may be computed at a rate of 4 clock cycles per codeword, even though the codeword length is less than 4 times the bus width (e.g., only 3.5 times the bus width in this example).

To improve speed and throughput of the decoding, portions of different codewords may be processed concurrently (e.g., during the same clock cycle). In a particular implementation, the first 192 bits of the codeword may be stored as 3 64-bit words. Additionally, the last 32 bits of the codeword and the last 32 bits of a second codeword may be stored together as an additional 64-bit word. During decoding, while computing the parity word p(x), the contribution of the first three 64-bit words to the parity word p(x) may be computed "on the fly" in a main decoder unit during the first three clock cycles. The 4th 64-bit word may be divided into two 32-bit words and the contribution of each 32-bit word to the parity word p(x) of the corresponding codeword may be computed at two residual decoding units (or two tag decoding units) during the fourth clock cycle. If the codewords are read in a sequential mode then the next codeword to be decoded is the codeword associated with the last 32 bits of the 4th 64-bit word. Because the contribution of the 32 bits to the next parity word has already been calculated (e.g., during the 4th clock cycle), the next parity word may be calculated after 3 clock cycles. Thus, two consecutive codewords are decoded after a total of 7 clock cycles instead of after 8 clock cycles, thereby reducing a duration decoding 2 codewords by 1 clock cycle (or an average reducing the duration of decoding each codeword by 0.5 clock cycles).

FIG. 5. illustrates a portion of an ECC engine that reduces the average number of clock cycles used to decode a codeword. The system of FIG. 5 may be included in an encoder or portion (corresponding to a first phase) of a decoder that generates a parity word by encoding data (e.g., a codeword) read from a memory. The computed parity word may be compared with a stored parity word as an additional part of a decoding (or encoding) process (not shown in FIG. 5). In FIG. 5, during the first three clock cycle of a clock signal, 64 bit words may be read from the memory and input to a demultiplexer 502. The demultiplexer also receives the clock signal. In the particular implementation illustrated in FIG. 5, the clock signal is periodic with period of 7. During clock cycles 0, 1, 2, 4, 5, and 6, received bits may be provided as input to a main encoder 504. The main encoder 504 may be configured to generate an output based on the received bits, such as a 20-bit output in implementations having a 20-bit parity word.

During clock cycle 3, the received bits (e.g., the 64-bit word) may be provided as input to a residual parity generator 506. The residual parity generator 506 may be configured to generate 2 residual parity words each having a length of 20 bits. A first residual parity word may correspond to a first portion of the received bits, and a second residual parity word may correspond to a second portion of the received bits. The residual parity words, a "0 vector" (e.g., a vector of bits having 0 values), and the clock signal may be provided as input to a multiplexer 510. In the particular implementation of FIG. 5, the multiplexer 510 is configured to output the 20 bit 0-vector as output during clock cycles 0, 1, 2, 4, and 5. During clock cycle 3, the multiplexer 510 may be configured to output the first residual parity word (e.g., a first residual parity vector), and during clock cycle 6 the multiplexer 510 may be configured to output the second residual parity word (e.g., a second residual parity vector). A XOR unit 512 may be configured to perform a XOR operation on the output of the multiplexer 510, the output of the main encoder 504, and a current value of the parity word (e.g., an incomplete parity word stored at a register) to generate the parity word. After clock cycle 3, the parity word output by the XOR unit 512 corresponds to the first codeword, and after clock cycle 6 the parity word corresponds to the second codeword. Thus, the ECC engine 500 may encode two parity words of two codewords during a total of 7 clock cycles, as compared to other methods generate one parity word every 4 clock cycles. Although a bus width of 64 bits, a parity word length of 20 bits, and a period of 7 of the clock signal are described above, in other examples the bus width, the parity word length, and the period of the clock signal may have different values.

Figure 6:
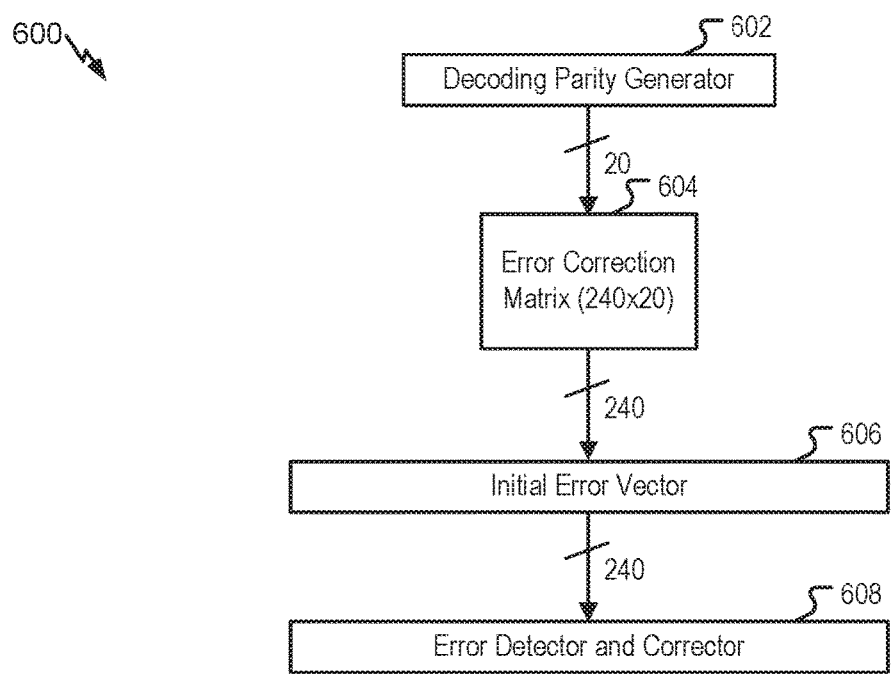
FIG. 6 is a block diagram of an illustrative example of an encoding circuit and a second illustrative example of a decoder.

Referring to FIG. 6, an illustrative example of a decoder is shown and designated 600. In a particular implementation, the decoder 600 may be included in an ECC engine, such as the ECC engine 166 of the data storage device 102 of FIG. 1. The decoder 600 includes a decoding parity generator 602, an error correction matrix 604 coupled to the decoding parity generator 602, an initial error vector memory 606 (e.g., a register, a latch, etc.) coupled to receive an output of the error correction matrix 604, and an error detector and corrector 608 coupled to the initial error vector memory 606. The decoding parity generator 602 may be configured to generate decoding parity bits. For example, the decoding parity generator 602 may perform a XOR operation based on received parity bits and generated parity bits to generate the decoding parity bits, as described with reference to FIG. 4. In some implementations, the decoding parity generator 602 may include or correspond to the system of FIG. 5. The decoding parity bits may be multiplied by the error correction matrix 604 to generate an initial error vector based on the decoding parity bits and a cyclic ECC code, such as a BCH code. The initial error vector memory 606 may be configured to store the initial error vector. In a particular implementation, the decoding parity bits are 20 bits, the error correction matrix 604 is a 240×20 matrix, and the initial error vector is 240 bits. In other implementations, the decoding parity bits, the error correction matrix 604, and the initial error vector may be other sizes.

The error detector and corrector 608 may be configured to partition the initial error vector into multiple consecutive sections. For example, with reference to FIG. 6, the initial error vector may be partitioned into 12 consecutive sections of 20 bits each. The error detector and corrector 608 may be further configured to identify each section having a Hamming weight that is greater than 1 and to replace each of these sections with all logical 0 values. After the replacement, the error vector has at most one section having a Hamming weight equal to 1. The error detector and corrector 608 may further be configured to identify the location of the error, and to correct the error, based on identification of a section of the error vector having a Hamming weight equal to 1. Because the partitioning and replacement of error vector sections can be performed concurrently, the decoder 600 may have increased speed and efficiency as compared to a decoder that does not partition an error vector. For example, the decoder 600 may detect (and correct) a single error in a single clock cycle.

Figure 7:
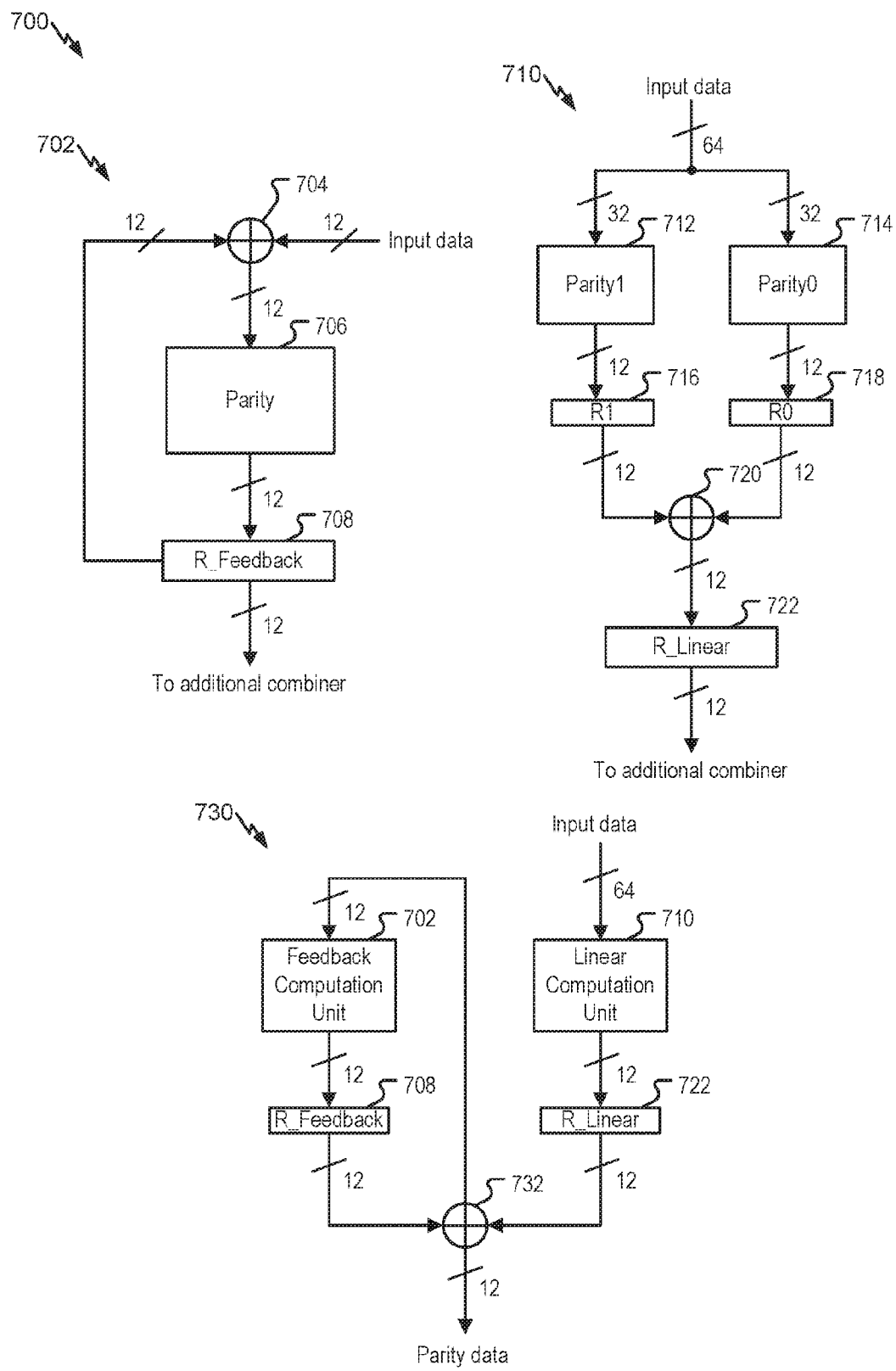
FIG. 7 is a block diagram of an illustrative example of an encoder architecture.

Referring to FIG. 7, an example of an encoder architecture 700 is shown. In a particular implementation, the encoder may be included in an ECC engine, such as the ECC engine 166 of the data storage device 102 of FIG. 1.

FIG. 7 illustrates a feedback computation unit 702. The feedback computation unit 702 includes a combiner 704, a parity generator 706 coupled to the combiner 704, and a feedback register 708 ("R_Feedback") coupled to the parity generator 706 and to the combiner 704. The combiner 704 may include an adder and may be configured to add input data to an output of the feedback register 708. In other implementations, the combiner 704 may perform a different operation.

The parity generator 706 may generate parity data (e.g., a parity word) based on the output of the combiner 704. For example, the parity generator 706 may generate the parity data based on a cyclic code. To illustrate, if a generating polynomial g(x) divides $x^N+1$, then g(x) may define a cyclic code of length N. An information section of a codeword generated based on the cyclic code may include N−deg(g) bits, and a parity section of the codeword may include deg(g) bits. Although referred to as "parity data" or "parity words" with reference to FIGS. 7-9, the data generated based on the cyclic code may also be referred to as "CRC data" or "CRC words".

Information may be embedded in a message polynomial a(x) and may be encoded into a codeword polynomial $x^{deg(g)}a(x)\ p(x)$, where $p(x)=x^{ord(g)}a(x)\mod(g(x))$. In a particular implementation, the information length may be 1024 bits, a codeword length may be greater than $2^{10}$ bits, and the parity may be greater than 10 bits such that there are more than $2^{10}$ different parity words to distinguish all single error patterns. For example, the parity may be 12 bits (to provide single error correct, double error detect (SEC-DEC) capability), $g(x)=(x+1)(x^{11}+x^2+1)$, $N=2^{11}-1=2047$, and the information may be received in z-tuples, where z is 64 or 128.

The feedback register 708 may be configured to receive the parity data from the parity generator 706 and to store the parity data across multiple clock cycles (e.g., across multiple pipeline stages). The parity data from the feedback register 708 may be provided to the combiner 704 and to another combiner. In a particular implementation, the input data and the parity data are 12 bits. In other implementations, the input data and the parity data are fewer than or more than 12 bits.

FIG. 7 also illustrates a linear computation unit 710. The linear computation unit 710 includes a first parity generator 714 ("Parity0"), a first register 718 ("R0") coupled to the first parity generator 714, a second parity generator 712 ("Parity1"), a second register 716 ("R1") coupled to the second parity generator 712, a combiner 720 coupled to the first register 718 and to the second register 716, and a linear register 722 ("R_Linear") coupled to the combiner 720. Input data may be partitioned into two sections, and each of the parity generators 712 and 714 may receive one section of the input data. In a particular implementation, the input data is 64 bits and the partitioned sections are 32 bits. In other implementations, the input data is fewer than or more than 64 bits, and the partitioned sections are fewer than or more than 32 bits.

Each of the parity generators 712 and 714 may generate corresponding parity data based on the corresponding partitioned section of the input data. For example, each of the parity generators 712 and 714 may generate the corresponding parity data based on a cyclic parity code, as described with reference to the parity generator 706. The parity generators 712 and 714 may provide the corresponding parity data to the registers 716 and 718, respectively. The registers 716 and 718 may be configured to store the received parity data across multiple clock cycles. Each of the registers 716 and 718 may provide the corresponding stored parity data to the combiner 720. The combiner 720 may be configured to generate output data based on the parity data received from the registers 716 and 718. For example, the combiner 720 may include an adder that is configured to add the parity data. The linear register 722 may be configured to store the output of the combiner 720 across multiple clock cycles to generate parity data of the linear computation unit. The parity data may be provided to another combiner. In a particular implementation, the parity data stored in the registers 716, 718, and 722 are 12 bits. In other implementations, the parity data stored in the registers 716, 718, and 722 are fewer than or more than 12 bits.

FIG. 7 also illustrates a decoder architecture 730. The decoder architecture includes the feedback computation unit 702, the feedback register 708 coupled to the feedback computation unit 702, the linear computation unit 710, the linear register 722 coupled to the linear computation unit 710, and a combiner 732 coupled to the feedback register 708 and to the linear register 722. Although described above as part of the feedback computation unit 702 and the linear computation unit 710, respectively, in the decoder architecture 730 the feedback register 708 and the linear register 722 are illustrated as distinct components.

The linear computation unit 710 may be configured to receive input data and to generate parity data, as described above. The linear register 722 may be configured to receive the first parity data from the linear computation unit 710 and to store the parity data across multiple clock cycles to generate a first parity matrix. The feedback computation unit 702 may be configured to receive an output of the combiner 732 and to generate parity data based on the output of the combiner 732, as described above. The feedback register 708 may be configured to receive the parity data from the feedback computation unit 702 and to store the parity data across multiple clock cycles to generate a second parity matrix. The combiner 732 may be configured to generate parity data, such as an output parity matrix, based on the first parity matrix and based on the second parity matrix. For example, the combiner 732 may be configured to perform a XOR operation to combine the first parity matrix and the second parity matrix to generate the parity data. The parity data may be used to detect or to correct one or more errors in the input data to the decoder architecture 730.

Figure 8:
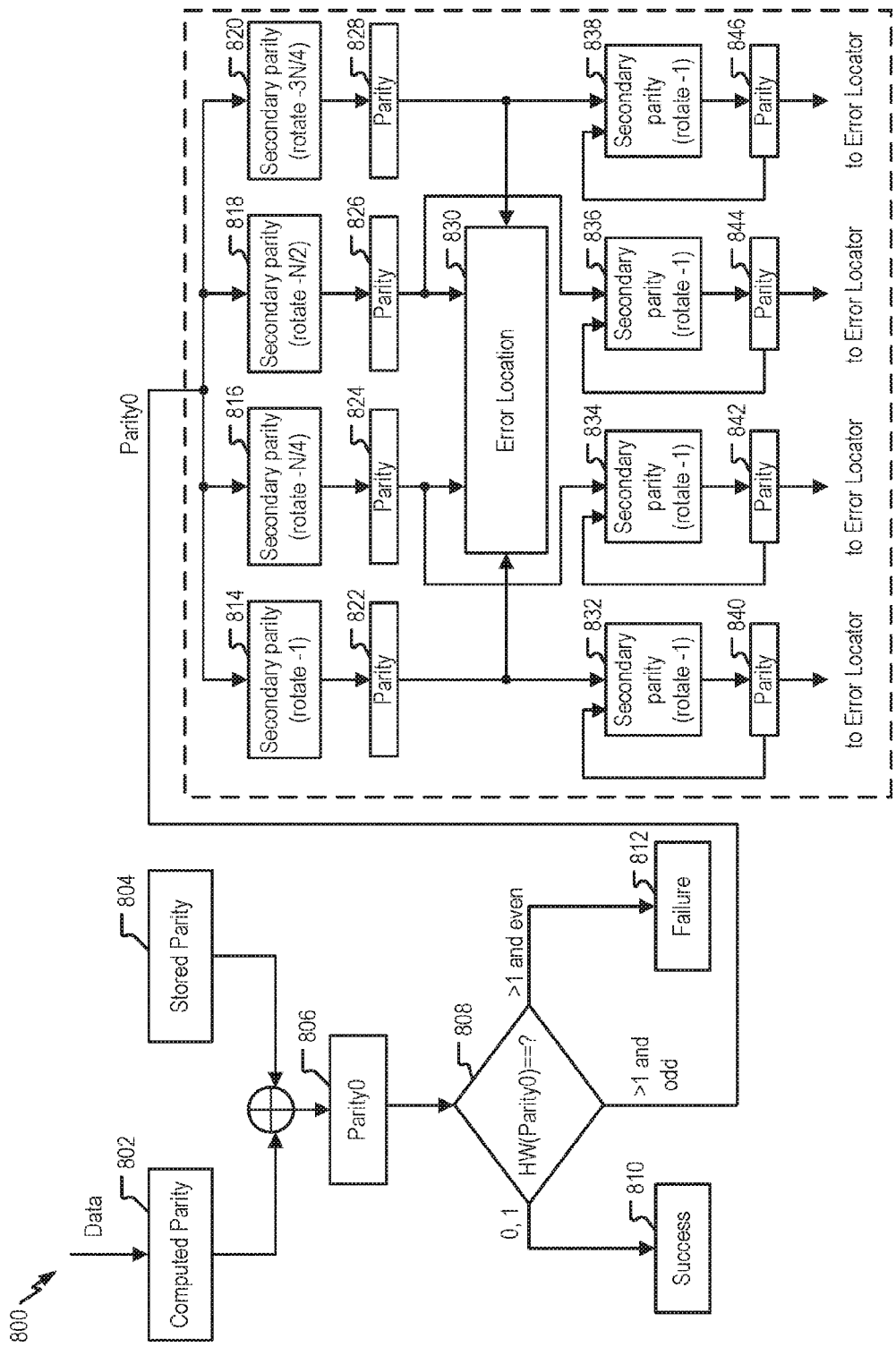
FIG. 8 is a flow diagram that illustrates an example of a method of correcting a single error in data.

Referring to FIG. 8, a particular example of a method 800 of correcting a single error in data is shown. In a particular implementation, the method 800 may be performed by an ECC engine, such as the ECC engine 166 of the data storage device 102 of FIG. 1.

The method 800 may be used to correct a single error with reduced latency as compared to other single error correction methods. To illustrate, the method 800 includes receiving data (e.g., a codeword) and encoding information bits of the received codeword to generate a computed encoding, at 802. For example, the information bits may be encoded using a cyclic code. Encoding the information bits of the received codeword generates parity bits ("computed parity bits"). The method 800 includes receiving a stored set of parity bits, at 804. For example, the received parity bits may be stored at a memory and may also referred to as stored parity bits. The method 800 includes combining the computed parity bits and the received parity bits (e.g., by performing a XOR operation) to generate parity data parity0, at 806.

The method 800 includes determining a weight of Parity0, at 808. For example, a Hamming weight of Parity0 (e.g., HW(Parity0)) may be determined. The Hamming weight of Parity0 indicates the number of bits of Parity0 that have a value that is different than a logical zero value. A bit having a different value (e.g., a logical one value) indicates an error. If the Hamming weight is 0 or 1, there are no errors (e.g., the computed parity bits match the received parity bits) or there is a single error, and the received codeword is correctable. The received codeword is successfully decoded (and the single error is corrected if present) at 810. If the Hamming weight is an even value that is greater than 1, an error condition or failure condition occurs, at 812. For example, all correct codewords generated using the cyclic code may have an even number of bits having a logical one value, and if the Hamming weight is greater than 1, the received codeword has multiple errors and may be uncorrectable using the method 800.

If the Hamming weight is an odd value that is greater than 1, the codeword may be rotated to identify a correctable error. To illustrate, the method 800 includes rotating the codeword by different amounts to generate additional parity data. For example, the method 800 includes generating first secondary parity data (e.g., using a rotate by 1 operation), at 814, generating second secondary parity data (e.g., using a rotate by N/4 operation), at 816, generating third secondary parity data (e.g., using a rotate by N/2 operation), at 818, and generating fourth secondary parity data (e.g., using a rotate by 3N/4 operation), at 820. The method 800 includes providing the first secondary parity data to an error locator, at 822, providing the second secondary parity data to the error locator, at 824, providing the third secondary parity data to the error locator, at 826, and providing the fourth secondary parity data to the error locator, at 828. The method 800 includes locating an error based on the secondary parity data, at 830. For example, an error locator may analyze the secondary parity data to determine if a single error is detected within a particular section of the secondary parity words.

The method 800 also includes generating additional secondary parity data based on the secondary parity data. For example, the method 800 includes generating fifth secondary parity data 840 (e.g., using a rotate by 1 operation), at 832, generating sixth secondary parity data 842 (e.g., using a rotate by 1 operation), at 834, generating seventh secondary parity data 844 (e.g., using a rotate by 1 operation), at 836, and generating eighth secondary parity data 846 (e.g., using a rotate by 1 operation), at 838. The method 800 returns to 830 to perform error location based on the additional secondary parity data 840-846.

In this manner, a single error may be corrected (and multiple errors may be detected) using a cyclic code. Performing multiple rotations concurrently may decrease the latency of the error correction and detection.

Figure 9:
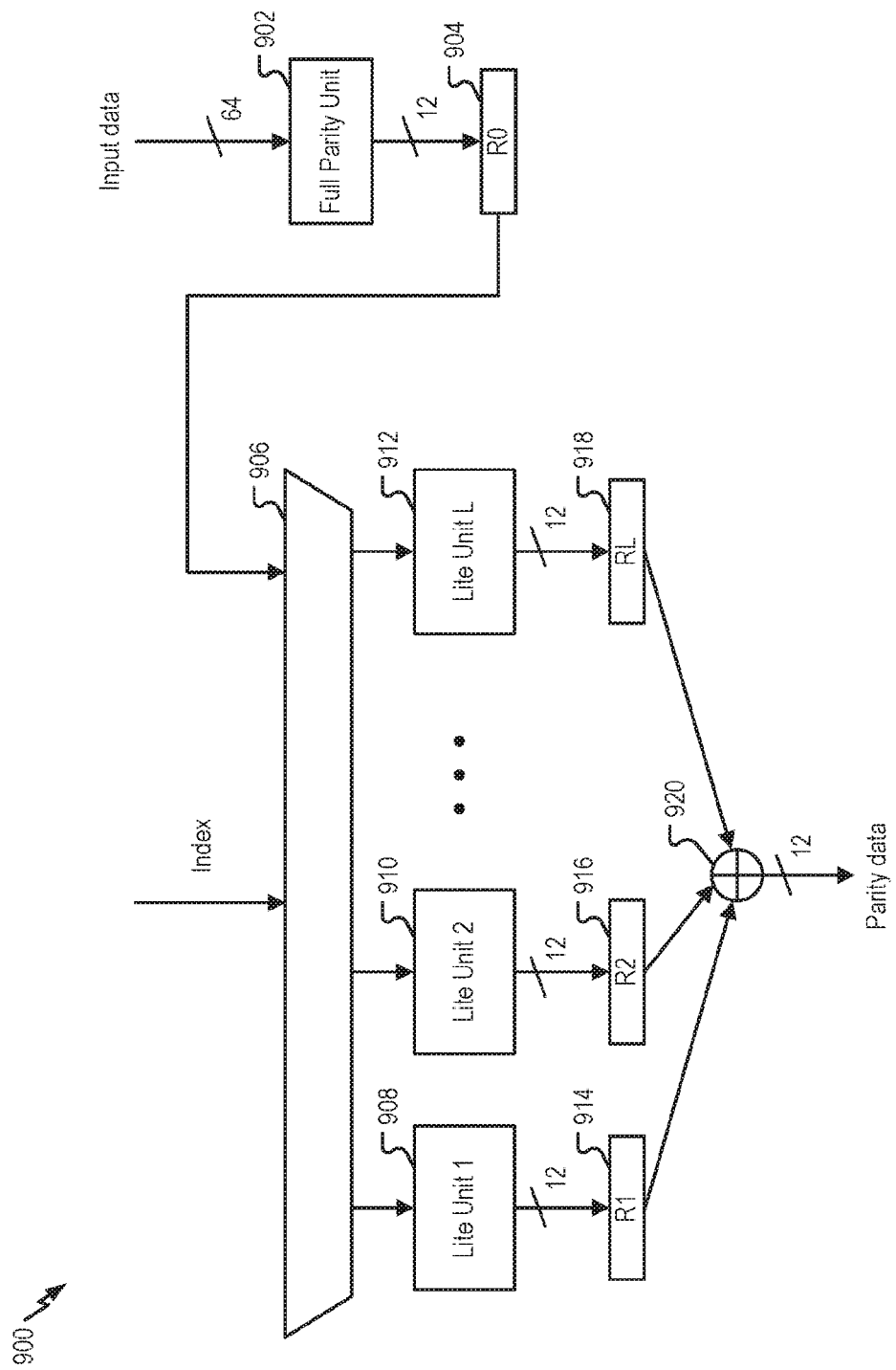
FIG. 9 is a block diagram of an illustrative example of a system configured to compute cyclical redundancy check (CRC) bits out of order.

Referring to FIG. 9, an example of a system configured to compute parity bits out of order is shown and generally designated 900. In a particular implementation, the system 900 may be included in an ECC engine, such as the ECC engine 166 of the data storage device 102 of FIG. 1.

The system 900 may be configured to generate parity data when z-tuples (e.g., data chunks) of input data are received out of order. The system 900 includes a full parity unit 902, an initial register 904, a de-multiplexer 906, a first lite unit 908, a second lite unit 910, a Lth lite unit 912, a first register 914, a second register 916, a Lth register 918, and a combiner 920. The full parity unit 902 may be configured to receive input data and to generate parity data based on the input data. The initial register 904 may be configured to store the parity across multiple clock cycles. In a particular implementation, each clock cycle 64 bits of input data are provided to the full parity unit 902 for processing. Additionally, each clock cycle an index of the 64-bit data chunk within a codeword, such as a 1 KB codeword, is received by the system 900.

The de-multiplexer 906 may be configured to receive, at each clock cycle, the parity data generated during the previous clock cycle and the index associated with the previous clock cycle. The de-multiplexer 906 may be configured to provide the received parity data to one of the lite units 908-912 based on the index. Each of the lite units 908-912 may include or correspond to a matrix. The number of lite units L may be equal to the number of information bits in the received codeword divided by a bus width associated with the system 900. In a particular implementation, the information length is 1 KB, the bus width is 64 bits, the number of lite units L is 128, the full parity unit 902 includes a 64×12 matrix, and each lite unit 908-912 includes a 12×12 matrix. The outputs of the lite units 908-912 are provided to the registers 914-918. The combiner 920 is configured to receive outputs from the registers 914-918 and to combine the outputs (e.g., by performing a XOR operation on the outputs). The output of the combiner 920 may be stored in a register, and after all the data chunks are processed, the register may store parity data (e.g., the result of the parity computations performed by the system 900).

Figure 10:
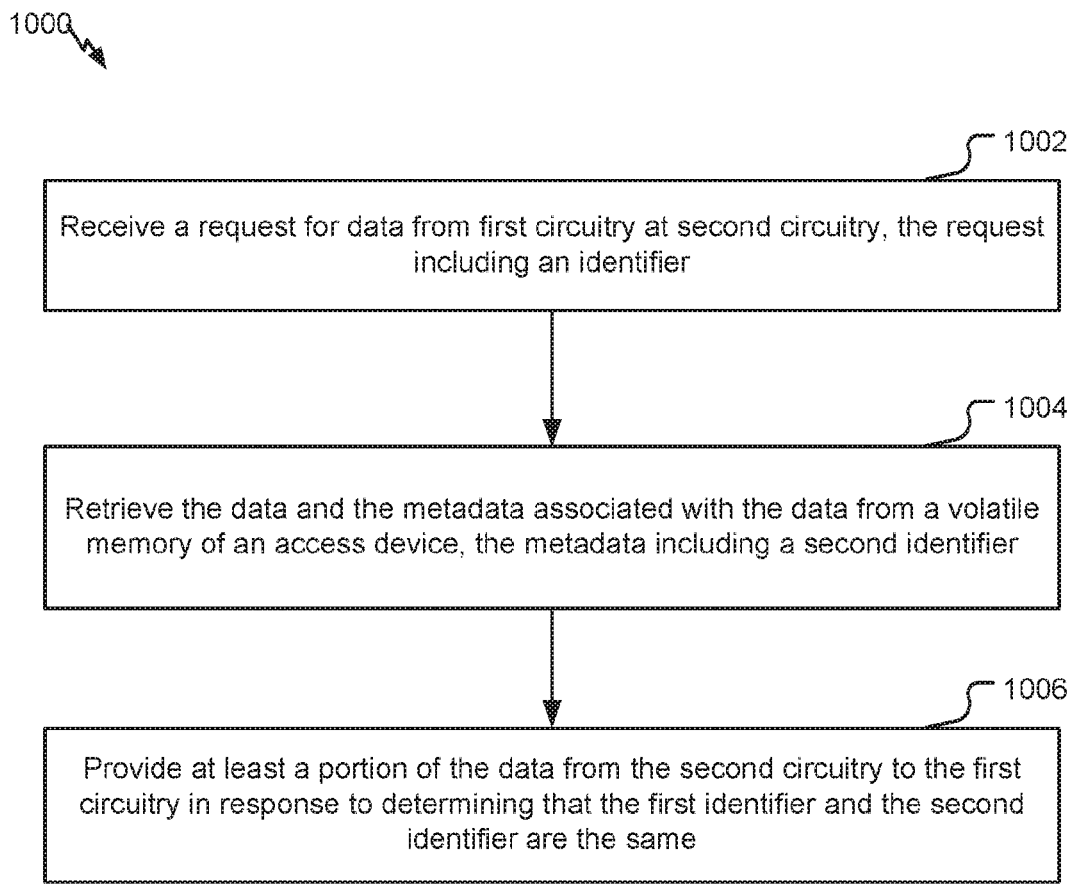
FIG. 10 is a flow diagram that illustrates an example of a method of verifying and selectively providing data read from a memory of an access device.

Referring to FIG. 10, a particular illustrative example of a method 1000 of verifying and selectively providing data read from a memory of an access device is shown. The method 1000 may be performed at a data storage device, such as at the controller 120 of the data storage device 102 of FIG. 1.

The method 1000 includes receiving a request for data from first circuitry at second circuitry, the request including a first identifier, at 1002. For example, the request may include the data request 176, the first circuitry may include the memory management circuitry 162, the second circuitry may include the access device management circuitry 164, and the first identifier may include the first identifier 179 of FIG. 1.

The method 1000 includes retrieving the data and metadata associated with the data from a volatile memory of an access device, the metadata including a second identifier, at 1004. For example, the data may include the data 153, the metadata may include the metadata 154, the volatile memory may include the HMB 151, and the access device may include the access device 150 of FIG. 1. The metadata 154 may be associated with the data 153 and may include the second identifier 147.

The method 1000 further includes providing at least a portion of the data from the second circuitry to the first circuitry in response to determining that the first identifier and the second identifier are the same, at 1006. For example, the access device management circuitry 164 (e.g., the data integrity manager 170) may provide at least a portion of the data 153 to the memory management circuitry 162 in response to a determination that the first identifier 179 and the second identifier 147 are the same.

In a particular implementation, the method 1000 includes sending an error notification to the access device in response to determining that the first identifier and the second identifier are different. For example, the error notification may include or correspond to the error notification 157. The error notification may include a pool tag associated with a memory page of the volatile memory or an address range of corrupted data. For example, the pool tag may include or correspond to the pool tag 158, and the address range may include or correspond to the range 159 of FIG. 1.

In another particular implementation, retrieving the data and the metadata may include retrieving a first packet and a second packet from the access device. The first packet may include at least a portion of the data and the second packet may include the metadata. For example, data packets may be retrieved from a HMB that stores data and metadata in accordance with the first layout 200, the third layout 220, or the fourth layout 230 of FIG. 2. Alternatively, the data and metadata may be retrieved in a single packet. For example, a data packet may be retrieved from a HMB that stores data and metadata in accordance with the second layout 210 of FIG. 2.

In another particular implementation, the request may include an address and the data and the metadata may be retrieved from the volatile memory based on a first subset of bits of the address. Additionally, the portion of the data that is provided to the first circuitry may include a particular portion of the data that is identified based on a second subset of bits of the address. For example, a data storage device may use a different address resolution than a HMB, and the data storage device may retrieve data from the HMB using a subset of an address (e.g., a subset that does not include at least one LSB of the address), and the portion of data may be selected based on the remainder of the address (e.g., the at least one LSB of the address), as described with reference to FIG. 1.

In another particular implementation, the method 1000 includes receiving second data from the first circuitry, generating second metadata that is associated with the second data and that includes a third identifier, and sending the second data and the second metadata to the access device for storage at the volatile memory.

In another particular implementation, the method 1000 includes determining an error vector based on the data, partitioning the error vector into multiple partitions, determining a particular partition of the multiple partitions that contains a single bit having an error value, and replacing the remaining partitions of the multiple partitions with bits having non-error values and decoding the multiple partitions to decode the data. For example, the error vector may include the initial error vector generated at the output of the error correction matrix 604 of FIG. 6, and the error vector may be partitioned into multiple partitions, some of which are replaced with bits having non-error values (e.g., logical 0 values), by the error detector and corrector 608 of FIG. 6.

In another particular implementation, the method 1000 includes concurrently encoding a first portion of an error correction code (ECC) codeword and tag parity data (e.g., residual parity data) that corresponds to a second portion of the ECC codeword, combining the encoded first portion of the ECC codeword and the encoded first portion of tag parity data to generate an encoded ECC codeword, and decoding a received codeword based on the encoded ECC codeword. For example, the first portion of the ECC codeword may be encoded by the main encoder 504 of FIG. 5, and the tag parity data may be generated and encoded by the residual parity generator 506 of FIG. 5.

The method 1000 may reduce size and cost of a data storage device by offloading storage of some data (e.g., frequently used data) to a volatile memory of an access device. Because the storage is offloaded, a volatile memory may not be included in the data storage device. Additionally, integrity of the data stored at the volatile memory may be verified, which may enable the data storage device to meet at least one criterion of an industry standard.

The method 300 of FIG. 3, the method 400 of FIG. 4, the method 800 of FIG. 8, the method 1000 of FIG. 10, or a combination thereof, may be initiated or controlled by an application-specific integrated circuit (ASIC), a processing unit, such as a central processing unit (CPU), a controller, another hardware device, a firmware device, a field-programmable gate array (FPGA) device, or any combination thereof. As an example, the method 300 of FIG. 3, the method 400 of FIG. 4, the method 800 of FIG. 8, the method 1000 of FIG. 10, or a combination thereof, can be initiated or controlled by one or more processors, such as one or more processors included in or coupled to a controller or a memory of the data storage device 102 and/or the access device 150 of FIG. 1. As an example, the method 300 of FIG.

3, the method 400 of FIG. 4, the method 800 of FIG. 8, the method 1000 of FIG. 10, or a combination thereof, individually or in combination, may be performed by the controller 120 of FIG. 1. To illustrate, a portion of the method 300 of FIG. 3, the method 400 of FIG. 4, a portion of the method 800 of FIG. 8, or a portion of the method 1000 of FIG. 10 may be combined with other operations described herein. Additionally, one or more operations described with reference to FIGS. 3, 4, 8, and 10 may be optional, may be performed at least partially concurrently, and/or may be performed in a different order than shown or described.

In an illustrative example, a processor may be programmed verify and selectively provide data read from a memory of an access device. For example, the processor may execute instructions to receive a request for data from first circuitry at second circuitry. The data may include a first identifier. The processor may execute instructions to retrieve the data and metadata associated with the data from a volatile memory of an access device. The metadata may include a second identifier. The processor may further execute instructions to provide at least a portion of the data from the second circuitry to the first circuitry in response to determining that the first identifier and the second identifier are the same.

Although various components of the data storage device 102 and/or the access device 150 of FIG. 1 are depicted herein as block components and described in general terms, such components may include one or more microprocessors, state machines, or other circuits configured to enable the various components to perform operations described herein. Components described herein may be operationally coupled to one another using one or more nodes, one or more buses (e.g., data buses and/or control buses), one or more other structures, or a combination thereof. One or more components described herein may include one or more physical components, such as hardware controllers, state machines, logic circuits, one or more other structures, or a combination thereof, to enable the data storage device 102 to perform one or more operations described herein. One or more aspects of the various components may be implemented using a microprocessor or microcontroller programmed to perform operations described herein, such as one or more operations of the method 300 of FIG. 3, the method 400 of FIG. 4, the method 800 of FIG. 8, or the method 1000 of FIG. 10. In a particular implementation, each of the controller 120, the memory 104, and/or the access device 150 of FIG. 1 includes a processor executing instructions that are stored at a memory, such as a non-volatile memory of the data storage device 102 or the access device 150 of FIG. 1. Alternatively or additionally, executable instructions that are executed by the processor may be stored at a separate memory location that is not part of the non-volatile memory, such as at a read-only memory (ROM) of the data storage device 102 or the access device 150 of FIG. 1.

In conjunction with the described aspects, an apparatus includes means for generating a request for data, the request including a first identifier. For example, the means for generating may include the memory management circuitry 162, the first processing thread 163, or the controller 120 of FIG. 1, one or more other devices, circuits, modules, or instructions to generate a request for data that includes a first identifier, or a combination thereof.

The apparatus further includes means for retrieving the data and metadata associated with the data from a volatile memory of an access device and for providing at least a portion of the data to the means for generating in response to a determination that the first identifier and a second identifier included in the metadata are the same. For example, the means for retrieving may include access device management circuitry 164, the data integrity manager 170, the access interface manager 172, or the controller 120 of FIG. 1, one or more other devices, circuits, modules, or instructions to retrieve data and metadata from a volatile memory of an access device and to provide at least a portion of the data to the means for generating in response to a determination that the first identifier and a second identifier included in the metadata are the same, or a combination thereof.

In a particular implementation, the apparatus includes means for decoding the at least a portion of the data. For example, the means for decoding may include ECC engine 166 or the controller 120 of FIG. 1, one or more other devices, circuits, modules, or instructions to decode at least a portion of data, or a combination thereof. The metadata may include ECC data, CRC data, and the second identifier, and the data may include a portion of logical to physical address mappings.

With reference to FIG. 1, in some implementations, the data storage device 102 may be embedded within the access device 150, such as in accordance with a Joint Electron Devices Engineering Council (JEDEC) Solid State Technology Association Universal Flash Storage (UFS) configuration. Alternatively, the data storage device 102 may be removable from the access device 150 (i.e., "removably" coupled to the access device 150). As an example, the data storage device 102 may be removably coupled to the access device 150 in accordance with a removable universal serial bus (USB) configuration. In some implementations, the data storage device 102 may include or correspond to a solid state drive (SSD) which may be included in, or distinct from (and accessible to), the access device 150. For example, the data storage device 102 may include or correspond to an SSD, which may be used as an embedded storage drive (e.g., a mobile embedded storage drive), an enterprise storage drive (ESD), a client storage device, or a cloud storage drive, as illustrative, non-limiting examples. In some implementations, the data storage device 102 may be coupled to the access device 150 indirectly, e.g., via a network. For example, the network may include a data center storage system network, an enterprise storage system network, a storage area network, a cloud storage network, a local area network (LAN), a wide area network (WAN), the Internet, and/or another network. In some implementations, the data storage device 102 may be a network-attached storage (NAS) device or a component (e.g., a solid-state drive (SSD) device) of a data center storage system, an enterprise storage system, or a storage area network.

In some implementations, the data storage device 102 may be configured to be coupled to the access device 150 as embedded memory, such as eMMC® (trademark of JEDEC Solid State Technology Association, Arlington, Va.) and eSD, as illustrative examples. To illustrate, the data storage device 102 may correspond to an eMMC (embedded MultiMedia Card) device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). Alternatively, the data storage device 102 may be removable from the access device 150 (e.g., "removably" coupled to the access device 150). As an example, the data storage device 102 may be removably coupled to the access device 150 in accordance with a removable universal serial bus (USB) configuration.

The data storage device 102 may operate in compliance with an industry specification. For example, the data storage device 102 may include a SSD and may be configured to communicate with the access device 150 using a small computer system interface (SCSI)-type protocol, such as a serial attached SCSI (SAS) protocol. As other examples, the data storage device 102 may be configured to communicate with the access device 150 using a NVM Express (NVMe) protocol or a serial advanced technology attachment (SATA) protocol. In other examples, the data storage device 102 may operate in compliance with a JEDEC eMMC specification, a JEDEC universal flash storage (UFS) specification, one or more other specifications, or a combination thereof, and may be configured to communicate using one or more protocols, such as an eMMC protocol, a UFS protocol, a USB protocol, and/or another protocol, as non-limiting examples.

In some implementations, the data storage device 102 and the access device 150 may be configured to communicate using one or more protocols, such as a SAS protocol, a SATA protocol, an NVMe protocol, an eMMC protocol, a UFS protocol, a USB protocol, and/or another protocol, as illustrative, non-limiting examples. The one or more protocols may include a standardized protocol and/or a non-standardized protocol, such as a proprietary protocol. As other examples, the access device 150 may operate in compliance with a JEDEC industry specification, such as a UFS Access Controller Interface specification. In some implementations, the data storage device 102 and the access device 150 may be configured to communicate using dual channel communication (e.g., both devices may issue and receive commands from the other device).

Semiconductor memory devices include volatile memory devices, such as dynamic random access memory ("DRAM") or static random access memory ("SRAM") devices, non-volatile memory devices, such as magnetoresistive random access memory ("MRAM"), resistive random access memory ("ReRAM"), electrically erasable programmable read only memory ("EEPROM"), flash memory (which can also be considered a subset of EEPROM), ferroelectric random access memory ("FRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure. In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements is formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where they direction is substantially perpendicular and the x and z directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in they direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of a non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor material such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Alternatively, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically used for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this disclosure is not limited to the two dimensional and three dimensional illustrative structures described but cover all relevant memory structures within the scope of the disclosure as described herein and as understood by one of skill in the art. The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Those of skill in the art will recognize that such modifications are within the scope of the present disclosure.

The above-disclosed subject matter is to be considered illustrative, and not restrictive, and the appended claims are intended to cover all such modifications, enhancements, and other embodiments, that fall within the scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A device comprising:
   a non-volatile memory;
   first circuitry configured to communicate with the non-volatile memory; and
   second circuitry configured to communicate with an access device configured to transfer data to the non-volatile memory, the second circuitry configured to retrieve data and metadata associated with the data from a volatile memory of the access device based on a request for the data, the request received from the first circuitry and including a first identifier, the metadata including a second identifier, wherein the second circuitry is further configured to provide at least a portion of the data to the first circuitry in response to the first identifier matching the second identifier, the second circuitry configured to compare the first identifier with the second identifier.

2. The device of claim 1, wherein the metadata includes error correction code (ECC) data, cyclical redundancy check (CRC) data, and the second identifier.

3. The device of claim 1, wherein the first identifier is associated with a processing thread that initiated generation of the request.

4. The device of claim 1, wherein pairs of data and corresponding metadata are interleaved at the volatile memory.

5. The device of claim 4, wherein a size of each pair fails to exceed a maximum size of a transport layer packet specified by the access device.

6. The device of claim 1, wherein blocks of data and blocks of metadata are stored at non-continuous locations at the volatile memory.

7. The device of claim 1, wherein pairs of blocks of data and corresponding blocks of metadata are interleaved at the volatile memory.

8. The device of claim 1, further comprising an error correction code (ECC) engine configured to perform single error correct, multiple error detect decoding on the data based on a cyclic code.

9. The device of claim 8, wherein the ECC engine is configured to detect up to ten errors and to correct up to one error based on the cyclic code.

10. The device of claim 1, further comprising an interface configured to receive one or more data packets from the access device, the one or more data packets including the data and the metadata.

11. The device of claim 1, the second circuitry configured to send an error notification to the access device in response to determining that the first identifier does not match the second identifier.

12. The device of claim 11, wherein the error notification includes a pool tag associated with a memory page of the volatile memory or an address range of corrupted data, the memory page or the corrupted data including the data.

13. A method comprising:
   at a device including a non-volatile memory and a controller, performing:
      receiving a request for data from first circuitry at second circuitry, the request including a first identifier;
      retrieving the data and metadata associated with the data from a volatile memory of an access device, the access device configured to transfer data to the non-volatile memory, the metadata including a second identifier;
      comparing the first identified to the second identifier with the second circuitry; and
      providing at least a portion of the data from the second circuitry to the first circuitry in response to determining that the first identifier and the second identifier are the same.

14. The method of claim 13, wherein retrieving the data and the metadata comprises receiving a first packet and a second packet from the access device, the first packet including at least a portion of the data and the second packet including the metadata.

15. The method of claim 13, wherein the request includes an address, wherein the data and the metadata are received from the volatile memory based on a first subset of bits of the address, wherein the at least a portion of the data includes a particular portion of the data, and wherein the particular portion is identified based on a second subset of bits of the address.

16. The method of claim 13, further comprising:
receiving second data from the first circuitry;
generating second metadata associated with the second data, the second metadata including a third identifier; and
sending the second data and the second metadata to the access device for storage at the volatile memory.

17. The method of claim 13, further comprising:
determining an error vector based on the data;
partitioning the error vector into multiple partitions;
determining a particular partition of the multiple partitions that contains a single bit having an error value; and
replacing the remaining partitions of the multiple partitions with bits having non-error values and decoding the multiple partitions to decode the data.

18. The method of claim 13, further comprising:
concurrently encoding a first portion of an error correction code (ECC) codeword and tag parity data, wherein the ECC codeword corresponds to second data, and wherein a first portion of the tag parity data includes a second portion of the ECC codeword;
combining the encoded first portion of the ECC codeword and the encoded first portion of the tag parity data to generate an encoded ECC codeword; and
decoding a received codeword based on the encoded ECC codeword.

* * * * *